United States Patent
Kitada et al.

(10) Patent No.: US 10,937,942 B2
(45) Date of Patent: Mar. 2, 2021

(54) PIEZOELECTRIC ELEMENT AND PIEZOELECTRIC ELEMENT-APPLIED DEVICE

(71) Applicant: Seiko Epson Corporation, Tokyo (JP)

(72) Inventors: Kazuya Kitada, Suwa (JP); Koji Sumi, Shiojiri (JP); Tomohiro Sakai, Matsumoto (JP); Toshiaki Takahashi, Chino (JP); Tsutomu Asakawa, Shiojiri (JP)

(73) Assignee: Seiko Epson Corporation

( * ) Notice: Subject to any disclaimer, the term of this patent is extended or adjusted under 35 U.S.C. 154(b) by 479 days.

(21) Appl. No.: 15/916,793

(22) Filed: Mar. 9, 2018

(65) Prior Publication Data
US 2018/0287048 A1    Oct. 4, 2018

(30) Foreign Application Priority Data

Mar. 28, 2017  (JP) .............................. JP2017-063761

(51) Int. Cl.
| | |
|---|---|
| *H01L 41/04* | (2006.01) |
| *H01L 41/187* | (2006.01) |
| *H01L 41/08* | (2006.01) |
| *B41J 2/14* | (2006.01) |
| *B41J 2/16* | (2006.01) |

(Continued)

(52) U.S. Cl.
CPC ....... *H01L 41/1132* (2013.01); *B41J 2/14233* (2013.01); *B41J 2/161* (2013.01);
(Continued)

(58) Field of Classification Search
CPC ............. H01L 41/1132; H01L 41/0471; H01L 41/0805; H01L 41/1873; H01L 41/1878;
(Continued)

(56) References Cited

U.S. PATENT DOCUMENTS

| | | | |
|---|---|---|---|
| 2007/0126313 A1* | 6/2007 | Ueno ...................... | H01L 41/18 310/311 |
| 2008/0308762 A1 | 12/2008 | Ueno et al. | |

(Continued)

FOREIGN PATENT DOCUMENTS

| | | |
|---|---|---|
| JP | 2006-306709 A | 11/2006 |
| JP | 2007-184513 A | 7/2007 |

(Continued)

OTHER PUBLICATIONS

Extended European Search Report for EP Application No. 18163254.8, dated Aug. 31, 2018 (7 pages).

(Continued)

*Primary Examiner* — Thomas M Dougherty
(74) *Attorney, Agent, or Firm* — Harness, Dickey & Pierce, P.L.C.

(57) ABSTRACT

A piezoelectric element includes a substrate, a first electrode formed on the substrate, a piezoelectric layer, which is a layered structure of a plurality of piezoelectric films each containing potassium, sodium, and niobium, formed on the first electrode, and a second electrode formed on the piezoelectric layer. A sodium concentration in the piezoelectric layer has a Na local maximum value, which is a local maximum value of the sodium concentration, in a first piezoelectric film, which is among the plurality of piezoelectric films, in the vicinity of the first electrode, a sodium concentration gradient decreasing from the Na local maximum value toward the second electrode, and a Na local minimum value, which is a local minimum value of the sodium concentration, near a boundary between the first piezoelectric film and a second piezoelectric film formed immediately above the first piezoelectric film.

16 Claims, 13 Drawing Sheets

(51) Int. Cl.
    *H01L 41/113*     (2006.01)
    *H01L 41/318*     (2013.01)
    *H01L 41/047*     (2006.01)
    *H01L 41/27*     (2013.01)
    *H01L 41/09*     (2006.01)

(52) U.S. Cl.
    CPC ........... *B41J 2/1623* (2013.01); *B41J 2/1628* (2013.01); *B41J 2/1629* (2013.01); *B41J 2/1632* (2013.01); *B41J 2/1634* (2013.01); *B41J 2/1642* (2013.01); *B41J 2/1645* (2013.01); *B41J 2/1646* (2013.01); *H01L 41/0471* (2013.01); *H01L 41/0805* (2013.01); *H01L 41/1873* (2013.01); *H01L 41/1878* (2013.01); *H01L 41/27* (2013.01); *H01L 41/318* (2013.01); *B41J 2002/14241* (2013.01); *B41J 2002/14419* (2013.01); *B41J 2202/03* (2013.01); *H01L 41/0973* (2013.01)

(58) Field of Classification Search
    CPC ... H01L 41/27; H01L 41/318; H01L 41/0973; B41J 2/14233; B41J 2/161; B41J 2/1623; B41J 2/1628; B41J 2/1629; B41J 2/1632; B41J 2/1634; B41J 2/1642; B41J 2/1645; B41J 2/1646; B41J 2002/14419; B41J 2202/03; B42J 2002/14241
    USPC .......................................... 310/311–371, 800
    See application file for complete search history.

(56) References Cited

U.S. PATENT DOCUMENTS

| | | |
|---|---|---|
| 2009/0044390 A1 | 2/2009 | Kuriki et al. |
| 2009/0213190 A1 | 8/2009 | Li |
| 2013/0009519 A1 | 1/2013 | Shibata et al. |
| 2014/0118446 A1 | 5/2014 | Izumi et al. |
| 2015/0109372 A1 | 4/2015 | Aida et al. |
| 2015/0303371 A1 | 10/2015 | Ueno et al. |
| 2016/0276572 A1 | 9/2016 | Sumi et al. |
| 2017/0062697 A1* | 3/2017 | Sakai ............... B41J 2/1629 |
| 2017/0229637 A1 | 8/2017 | Sakai et al. |

FOREIGN PATENT DOCUMENTS

| | | |
|---|---|---|
| JP | 2007-227677 A | 9/2007 |
| JP | 2008-270379 A | 11/2008 |
| JP | 2009-038169 A | 2/2009 |
| JP | 2011-204887 A | 10/2011 |
| JP | 2014-033210 A | 2/2014 |
| JP | 2015-082658 A | 4/2015 |
| JP | 2017-050352 A | 3/2017 |
| WO | WO-2012-141104 A1 | 10/2012 |

OTHER PUBLICATIONS

Wang L et al.: "Structures, electrical properties, and leakage current behaviors of un-doped and Mn-doped lead-free ferroelectric $K_{0.5}Na_{0.5}NbO_3$ films", Journal of Applied Physics, vol. 115, No. 3, 034103; Jan. 15, 2014 (Jan. 15, 2014), XP012180655, ISSN: 0021-8979; 7 pages.

JP 2007-184513 corresponds to U.S. Pub. No. 2008-0308762.
JP 2011-204887 corresponds to U.S. Pub. No. 2013-0009519.
JP 2006-306709 corresponds to U.S. Pub. No. 2009-0044390.
U.S. Appl. No. 15/378,474, filed Dec. 14, 2016, Tomohiro Sakai et al.

* cited by examiner

PIEZOELECTRIC ELEMENT AND PIEZOELECTRIC ELEMENT-APPLIED DEVICE

This application claims priority under 35 U.S.C. § 119 to Japanese Patent Application No. 2017-063761 filed on Mar. 28, 2017, the entire disclosure of which is expressly incorporated by reference herein.

BACKGROUND

1. Technical Field

The present invention relates to a piezoelectric element and a piezoelectric element-applied device including a piezoelectric element.

2. Related Art

Piezoelectric elements typically include a piezoelectric layer which exhibits electromechanical conversion characteristics, and two electrodes between which the piezoelectric layer is positioned. In recent years, the development of devices (piezoelectric element-applied devices) including such piezoelectric elements as driving sources has been actively investigated. Examples of piezoelectric element-applied devices include liquid ejecting heads, such as ink jet recording heads; MEMS components, such as piezoelectric MEMS elements; ultrasonic measuring devices, such as ultrasonic sensors; and piezoelectric actuator devices.

Potassium sodium niobate $((K,Na)NbO_3$, hereinafter referred to as "KNN") has been proposed for use as a piezoelectric layer material (piezoelectric material) of a piezoelectric element. KNN with relatively good piezoelectric characteristics is considered as a leading candidate for a lead-free piezoelectric material. In polycrystalline piezoelectric bodies, both in bulk and as thin films commonly, piezoelectric characteristics are known to be significantly enhanced by having a predetermined crystal orientation. Accordingly, efforts have been made to enhance piezoelectric characteristics by exploiting crystal orientation.

For example, Japanese Patent No. 5716799 describes that KNN, which is a piezoelectric body, is controlled to have a predetermined crystal orientation by the use of polycrystalline lanthanum nickel oxide ($LaNiO_3$, hereinafter referred to as "LNO") as an orientation control layer or the use of a single crystal substrate formed of niobium (Nb)-doped strontium titanate ($Nb:SrTiO_3$), for example.

LNO, however, tends to diffuse into a piezoelectric body during firing at a high temperature and thus cause compositional changes of the piezoelectric body. Moreover, a single crystal substrate formed of $Nb:SrTiO_3$ is costly and thus not practical.

Such issues are not limited to piezoelectric elements that are employed in piezoelectric actuators mounted on liquid ejecting heads, such as ink jet recording heads. Piezoelectric elements employed in other piezoelectric element-applied devices also share such issues.

SUMMARY

An advantage of some aspects of the invention is to provide a piezoelectric element that includes a piezoelectric layer formed of (100)-oriented KNN, and a piezoelectric element-applied device.

A piezoelectric element according to an aspect of the invention includes: a substrate; a first electrode formed on the substrate; a piezoelectric layer, which is a layered structure of a plurality of piezoelectric films each containing potassium, sodium, and niobium, formed on the first electrode; and a second electrode formed on the piezoelectric layer. A sodium concentration in the piezoelectric layer has a Na local maximum value, which is a local maximum value of the sodium concentration, in a first piezoelectric film, which is among the plurality of the piezoelectric films, in the vicinity of the first electrode, a sodium concentration gradient decreasing from the Na local maximum value toward the second electrode, and a Na local minimum value, which is a local minimum value of the sodium concentration, near a boundary between the first piezoelectric film and a second piezoelectric film formed immediately above the first piezoelectric film. In this aspect, a piezoelectric element including a piezoelectric layer formed of (100)-oriented KNN can be obtained.

In the piezoelectric element, an intensity ratio of the Na local maximum value to the Na local minimum value (Na local maximum value/Na local minimum value) is preferably 1.05 or higher. In this case, a piezoelectric element including a piezoelectric layer formed of further (100)-oriented KNN can be obtained.

In the piezoelectric element, the intensity ratio of the Na local maximum value to the Na local minimum value (Na local maximum value/Na local minimum value) is preferably 1.6 or lower. In this case, a piezoelectric element including a piezoelectric layer formed of further (100)-oriented KNN can be obtained.

In the piezoelectric element, a potassium concentration in the piezoelectric layer preferably has a K local maximum value, which is a local maximum value of the potassium concentration, near the boundary between the first piezoelectric film and the second piezoelectric film; and a potassium concentration gradient decreasing from the K local maximum value toward the first electrode. In this case, a piezoelectric element including a piezoelectric layer formed of further (100)-oriented KNN can be obtained.

In the piezoelectric element, an intensity ratio of the K local maximum value to a K inflection value (K local maximum value/K inflection value) is preferably 1.15 or higher, where the K inflection value is a value at an inflection point of the potassium concentration near a boundary between the first piezoelectric film and the first electrode. In this case, a piezoelectric element including a piezoelectric layer formed of further (100)-oriented KNN can be obtained.

In the piezoelectric element, the intensity ratio of the K local maximum value to the K inflection value (K local maximum value/K inflection value) is preferably 2.0 or lower. In this case, a piezoelectric element including a piezoelectric layer formed of further (100)-oriented KNN can be obtained.

In the piezoelectric element, the piezoelectric layer preferably contains 0.2 mol % or more and 2.0 mol % or less manganese. In this case, leakage current can be reduced readily, and thus a highly reliable piezoelectric element using a lead-free material can be realized.

In the piezoelectric element, the substrate preferably contains zirconium oxide. In this case, zirconium oxide as an insulator film functions as a barrier and thus can reduce the number of alkali metals, such as potassium and sodium, that reach the substrate.

A piezoelectric element-applied device according to another aspect of the invention includes any one of the above-mentioned piezoelectric elements. In this aspect, a piezoelectric element-applied device that achieves stabilized piezoelectric and dielectric characteristics, and high toughness (mechanical characteristics) against external stress can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
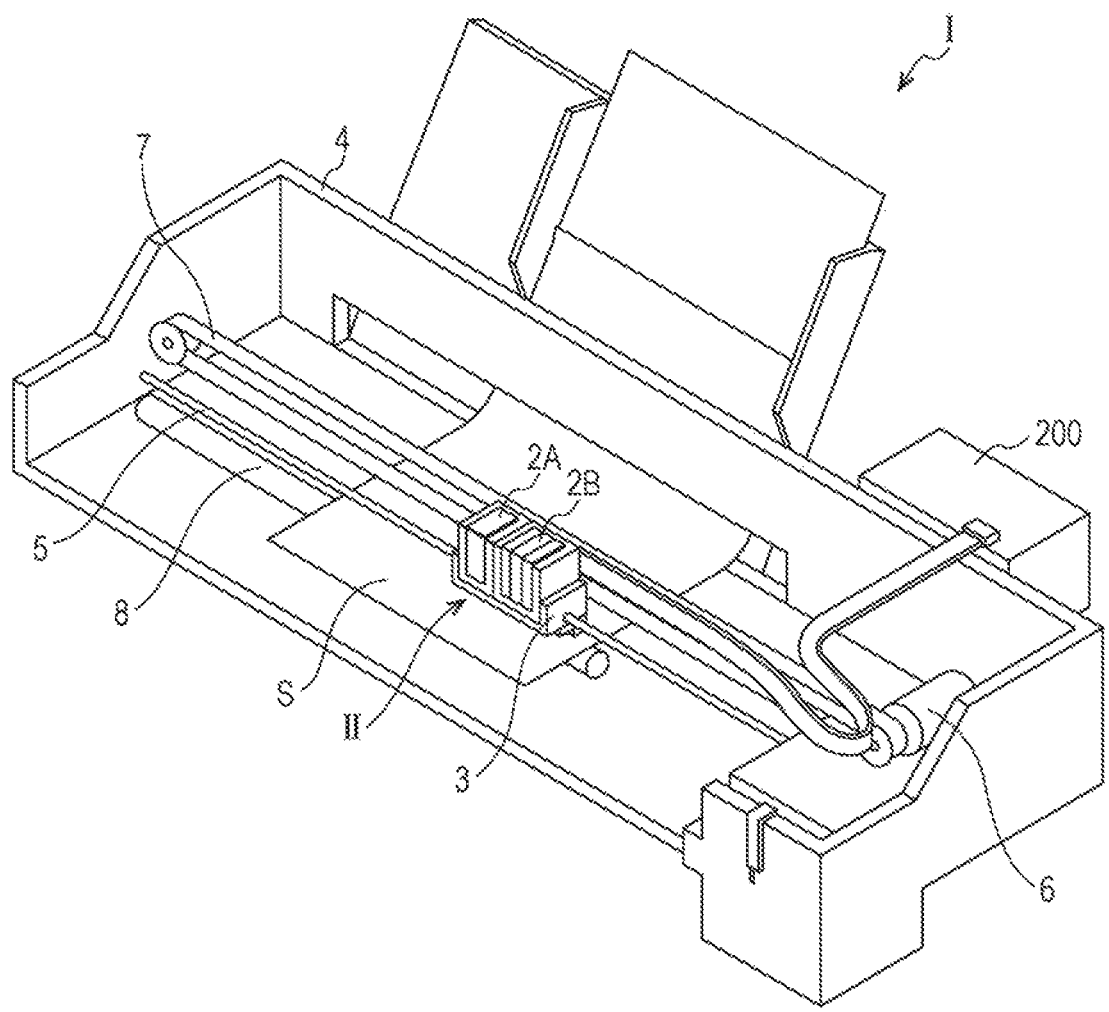
FIG. 1 is a perspective view illustrating a schematic configuration of an ink jet recording apparatus.

Hereinafter, embodiments of the present invention will be described with reference to the drawings. The description below illustrates only an aspect of the invention, and thus modifications are possible without departing from the spirit of the invention. In the drawings, like numerals denote like components and description thereof is omitted as appropriate. X, Y, and Z represent three mutually orthogonal spatial axes. In this specification, a description will be given with directions along these axes as a first direction X (X direction), a second direction Y (Y direction), and a third direction Z (Z direction), and a direction indicated by an arrow in the drawings as a positive (+) direction, and a direction opposite to the direction indicated by the arrow as a negative (−) direction. The X direction and the Y direction represent directions parallel to a plane of a sheet, a layer, and a film, and the Z direction represents a thickness direction or a stacking direction of a sheet, a layer, and a film.

The components illustrated in the drawings, i.e., the shape and/or size of each part; sheet, layer, and film thicknesses; relative positional relationships; and repeating units, for example, are sometimes exaggerated in illustrations of the invention. Further, the term "on" in the specification is not limited to "directly on" with respect to the positional relationships of the components. For example, expressions, such as "a first electrode on the substrate" and "a piezoelectric layer on the first electrode" do not exclude a case in which another component is placed between the substrate and the first electrode or between the first electrode and the piezoelectric layer.

Embodiment 1

Liquid Ejecting Apparatus

First, with reference to the drawings, an ink jet recording apparatus will be described as an exemplary liquid ejecting apparatus. FIG. 1 is a perspective view illustrating a schematic configuration of an ink jet recording apparatus. As illustrated, in an ink jet recording apparatus (recording apparatus) I, an ink jet recording head unit (head unit) II is detachably provided in cartridges 2A and 2B. The cartridges 2A and 2B constitute an ink supply mechanism. The head unit II includes a plurality of ink jet recording heads (recording heads) 1 (see FIG. 2, for example) described hereinafter and is mounted on a carriage 3. The carriage 3 is provided on a carriage shaft 5, which is fixed to an apparatus body 4, so as to be movable in the axial direction. The head unit II and the carriage 3 are each configured to discharge a black ink composition and a color ink composition, for example.

The driving force of a driving motor 6 is transmitted to the carriage 3 via a plurality of gears (not shown) and a timing belt 7 such that the carriage 3 on which the head unit II is mounted is moved along the carriage shaft 5. Meanwhile, a transport roller 8 is provided in the apparatus body 4 as a transport mechanism, and a recording sheet S, which is a recording medium such as paper, is transported by the transport roller 8. The transport mechanism for transporting the recording sheet S is not limited to a transport roller and may be a belt or a drum, for example.

Figure 2:
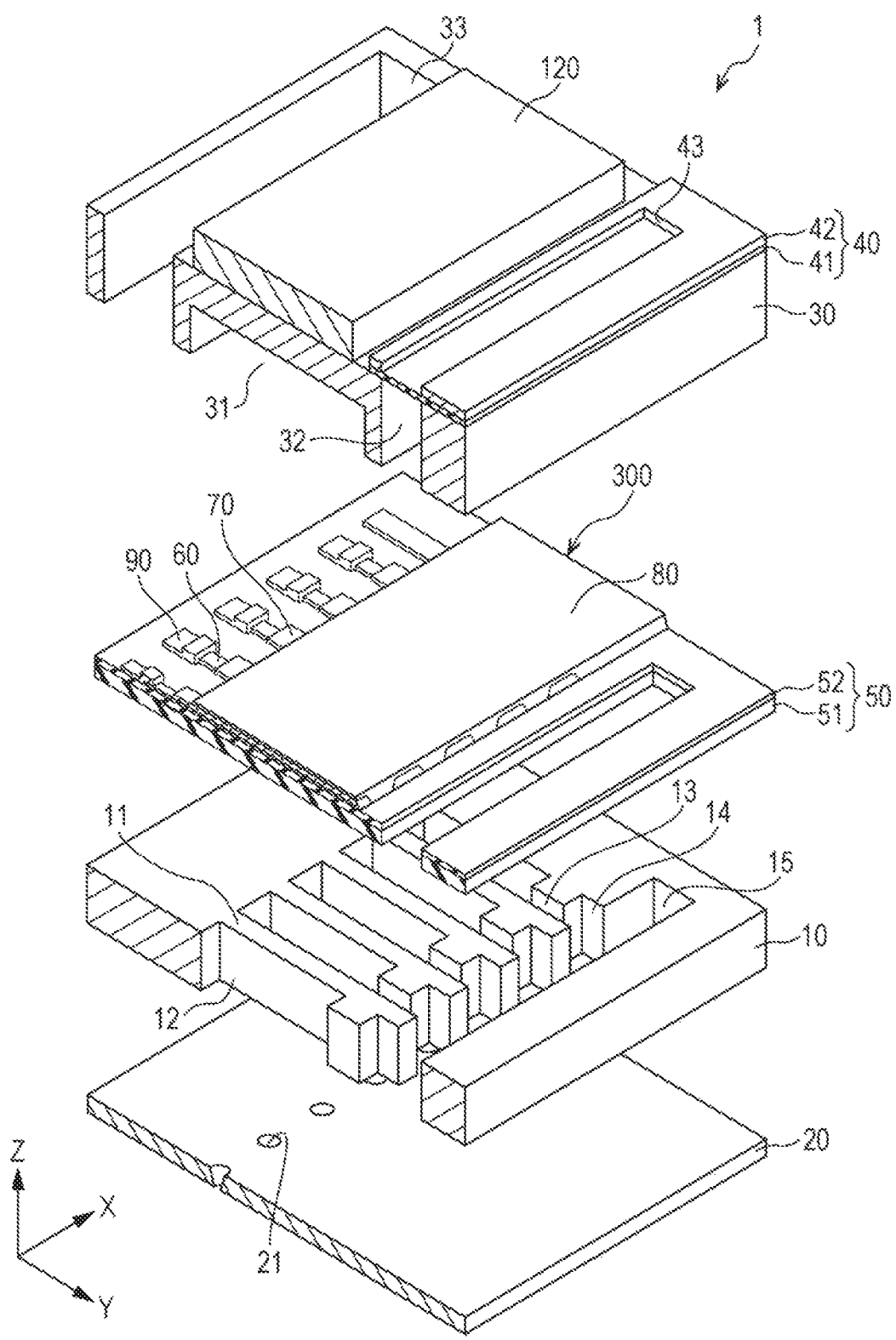
FIG. 2 is an exploded perspective view illustrating a schematic configuration of an ink jet recording head.

The recording head 1 employs a piezoelectric element 300 that is a flexural deformation-type piezoelectric element (flexural displacement-type piezoelectric element) as a piezoelectric actuator device (see FIG. 2, for example). By employing the piezoelectric element 300, a reduction in various characteristics (durability and ink ejection characteristics, for example) of the recording apparatus I can be avoided. Although a flexural displacement-type piezoelectric element is illustrated in the embodiment, other piezoelectric elements may be employed without departing from the spirit of the invention.

Liquid Ejecting Head

Figure 3:
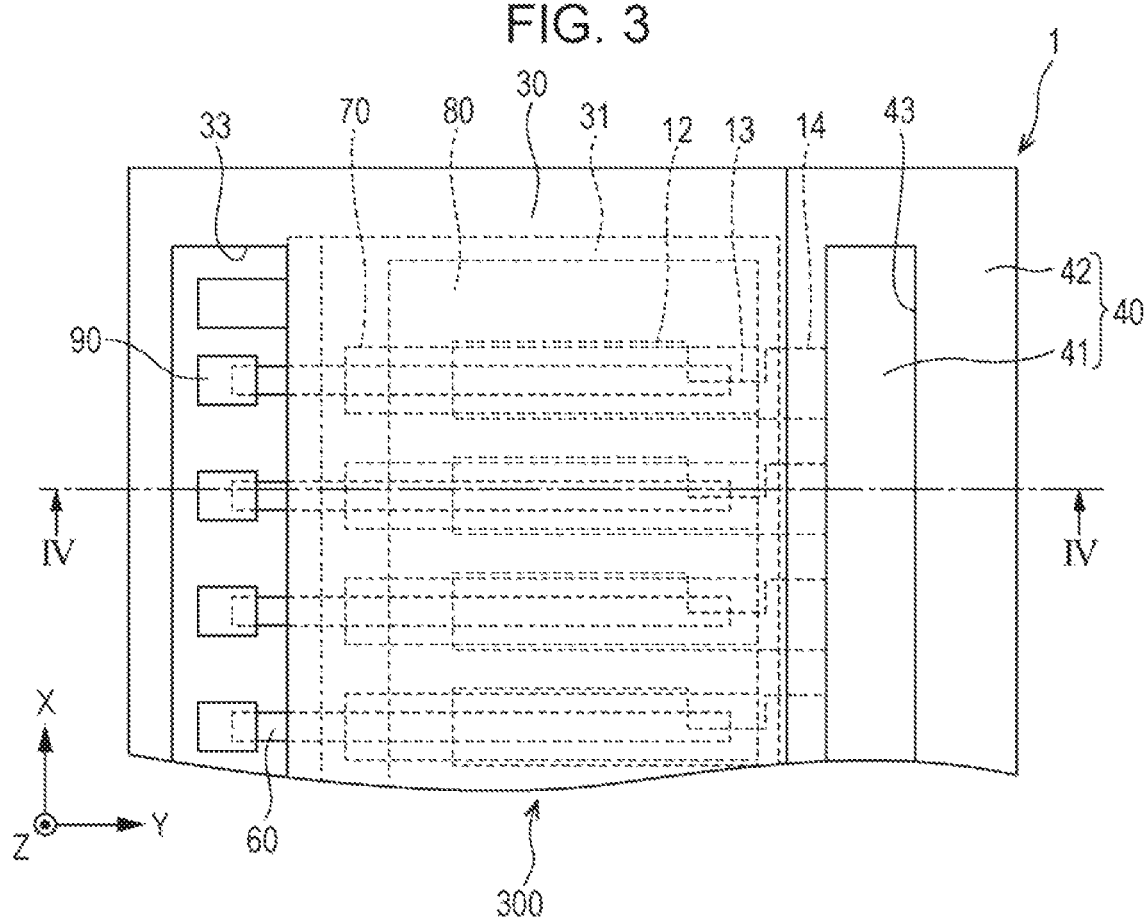
FIG. 3 is a plan view illustrating a schematic configuration of the ink jet recording head.
Figure 4:
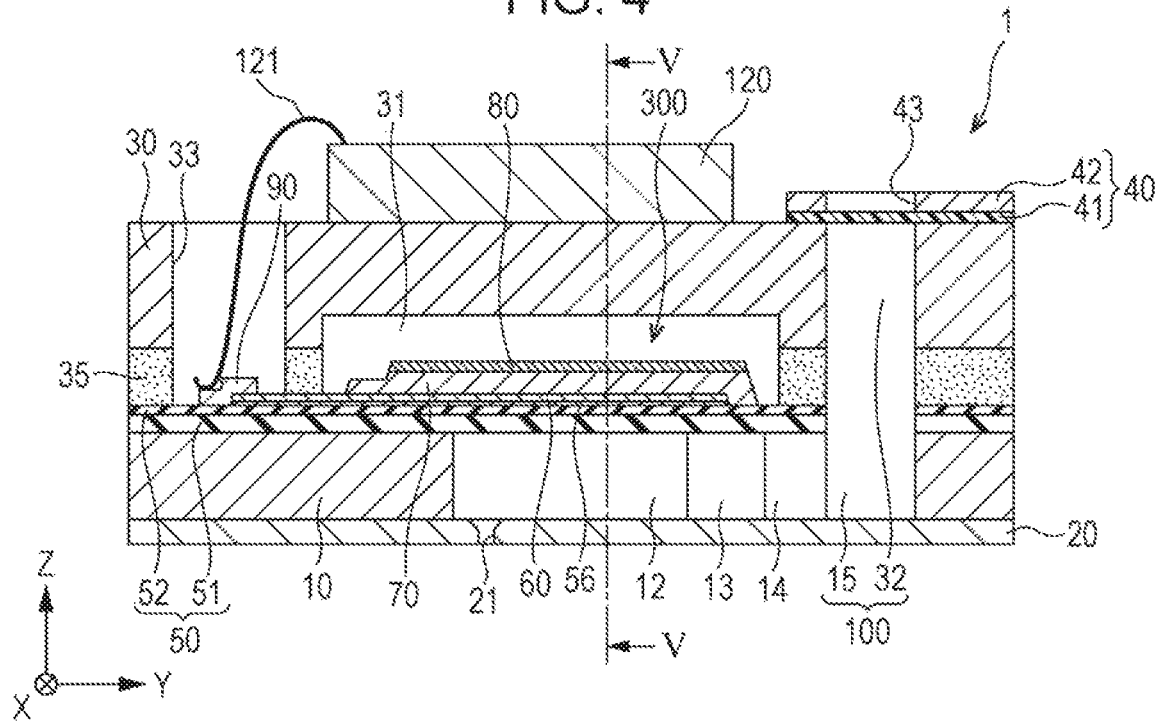
FIG. 4 is a sectional view taken along line IV-IV of FIG. 3.

Next, with reference to the drawings, the recording head 1 will be described as an example of a liquid ejecting head to be mounted on a liquid ejecting apparatus. FIG. 2 is an exploded perspective view illustrating a schematic configuration of an ink jet recording head. FIG. 3 is a plan view illustrating a schematic configuration of the ink jet recording head. FIG. 4 is a sectional view taken along line IV-IV in FIG. 3. FIGS. 2 to 4 each illustrate part of the configuration of the recording head 1, and the rest is omitted as appropriate.

As illustrated, a channel-forming substrate (substrate) 10 is formed of a silicon (Si) single crystal substrate, for example. A material for the substrate 10 is not limited to Si and may be SOI (silicon on insulator) or glass, for example.

In the substrate 10, pressure chambers 12 partitioned by a plurality of partition walls 11 are formed. The pressure chambers are provided aligning in a direction (+X direction) in which a plurality of nozzle openings 21 that discharge an ink of the same color are provided.

Ink supply paths 13 and communicating paths 14 are formed at one end (+Y direction end) of the pressure chambers 12 in the substrate 10. The ink supply paths 13 are formed so that the area of openings at one end of the pressure chambers 12 is decreased. The communicating paths have substantially the same widths as the pressure chambers 12 in the +X direction. Outside the communicating paths 14 (+Y direction side), a communicating portion 15 is formed. The communicating portion 15 constitutes part of a manifold 100. The manifold 100 constitutes a common ink chamber for pressure chambers 12. As described above, liquid channels including the pressure chambers 12, the ink supply paths 13, the communicating paths 14, and the communicating portion 15 are formed in the substrate 10.

A nozzle plate 20 made of SUS, for example, is joined to one surface of the substrate 10 (−Z direction side surface). In the nozzle plate 20, nozzle openings 21 aligning in the +X direction are provided. The nozzle openings 21 are connected to respective pressure chambers 12. The nozzle plate 20 and the substrate 10 can be joined to each other by using an adhesive or a heat-sealing film, for example.

A diaphragm 50 is formed on the other surface (+Z direction side surface) of the substrate 10. The diaphragm includes an elastic film 51 formed on the substrate 10 and an insulator film 52 formed on the elastic film 51. The elastic film 51 is formed of silicon dioxide ($SiO_2$), for example, and the insulator film 52 is formed of zirconium oxide ($ZrO_2$), for example. The elastic film 51 is not necessarily a component separate from the substrate 10. The elastic film 51 may be part of the substrate 10 reduced in thickness.

On the insulator film 52, the piezoelectric element 300 including a first electrode 60, a piezoelectric layer 70, and a second electrode 80 is formed via a bonding layer 56. The bonding layer 56 is formed of titanium oxide ($TiO_x$), titanium (Ti), or silicon nitride (SiN), for example, and serves to enhance adhesion between the piezoelectric layer and the diaphragm 50. The bonding layer 56 can be omitted.

In the case where alkali metals such as potassium (K) and sodium (Na) are contained in a piezoelectric body that forms the piezoelectric layer 70, such metals may diffuse into the first electrode 60 in the process of forming the piezoelectric layer 70 described hereinafter. By providing the insulator film 52 between the first electrode 60 and the substrate 10, the insulator film 52 functions as a barrier and thus can reduce the number of the alkali metals that reach the substrate 10.

The first electrodes 60 are each provided in pressure chambers 12. This means that the first electrodes are formed as independent, individual electrodes in respective pressure chambers 12. The first electrode 60 is formed to be narrower than the pressure chamber 12 in the ±X direction. Moreover, the first electrode 60 is formed to be wider than the pressure chamber 12 in the ±Y direction. This means that both ends of the first electrode 60 are formed outside a region on the diaphragm 50 facing the pressure chamber 12. One end of the first electrode 60 (the end opposite to the communicating path 14) is connected to a lead electrode 90.

Although not provided in the embodiment, a seed layer (also referred to as an orientation control layer) may be provided between the first electrode 60 and the piezoelectric layer 70 on the bonding layer 56, for example. The seed layer has a function of controlling the crystal orientation of a piezoelectric body that forms the piezoelectric layer 70. In other words, providing a seed layer can induce crystals of a piezoelectric body that forms the piezoelectric layer 70 to have a predetermined, preferred orientation.

The piezoelectric layer 70 is provided between the first electrode 60 and the second electrode 80. The piezoelectric layer 70 is formed to be wider in the ±X direction than the first electrode 60. Moreover, the piezoelectric layer 70 is formed to be wider in the ±Y direction than the length of the pressure chamber 12. The end of the piezoelectric layer 70 on the side of the ink supply path 13 (+Y direction side) is formed outside the end of the first electrode 60 on the +Y direction side. This means that the end of the first electrode 60 on the +Y direction side is covered with the piezoelectric layer 70. Meanwhile, the end of the piezoelectric layer 70 on the side of the lead electrode 90 (−Y direction side) is positioned inside (+Y direction side) compared with the end of the first electrode 60 on the −Y direction side. This means that the end of the first electrode 60 is not covered by the piezoelectric layer 70. The piezoelectric layer 70 is a thin-film piezoelectric body having a predetermined thickness described hereinafter.

The second electrode 80 is provided in a continuous manner on the piezoelectric layers 70 and the diaphragm 50 in the +X direction. In other words, the second electrode 80 is formed as a common electrode shared with a plurality of piezoelectric layers 70. In the embodiment, the first electrodes 60 are individual electrodes independently provided to respective pressure chambers 12, and the second electrode 80 constitutes a common electrode provided in a continuous manner in the aligning direction of the pressure chambers 12. Conversely, the first electrode 60 may constitute a common electrode and the second electrode 80 may be individual electrodes.

In the embodiment, the displacement of the piezoelectric layer 70 having electromechanical conversion characteristics causes the displacement of the diaphragm 50 and the first electrode 60. In other words, the diaphragm and the first electrode 60 substantially function as a diaphragm. Actually, however, the displacement of the piezoelectric layer 70 also causes the displacement of the second electrode 80. Accordingly, a region where the diaphragm 50, the bonding layer 56, the first electrode 60, the piezoelectric layer 70, and the second electrode 80 are successively stacked functions as a movable section (also referred to as a diaphragm section) of the piezoelectric element 300.

By omitting the elastic film 51 and the insulator film 52, the first electrode 60 alone may be set to function as a diaphragm. In the case where the first electrode 60 is provided directly on the substrate 10, the first electrode 60 is preferably protected by an insulating protective film, for example, to avoid contact with an ink.

A protective substrate 30 is joined, by using an adhesive 35, to the substrate 10 (diaphragm 50) on which the piezoelectric element 300 is formed. The protective substrate 30 has a manifold portion 32. The manifold portion 32 constitutes at least part of the manifold 100. The manifold portion 32 of the embodiment extends in the protective substrate 30 in the thickness direction (Z direction) and is further formed in the width direction (+X direction) of the pressure chambers 12. The manifold portion 32 is connected to the communicating portion 15 of the substrate 10. With the above configuration, the manifold 100 constituting a common ink chamber for pressure chambers 12 is formed.

In the protective substrate 30, a piezoelectric element holding portion 31 is formed in a region where the piezoelectric element 300 is present. The piezoelectric element holding portion 31 has a space that does not impede the movement of the piezoelectric element 300. The space may be sealed or non-sealed. The protective substrate 30 has a through hole 33 that extends in the protective substrate 30 in the thickness direction (Z direction). Inside the through hole 33, an end of the lead electrode 90 is exposed.

Examples of materials for the protective substrate 30 include Si, SOI, glass, ceramics, metal, and resins. The protective substrate 30, however, is preferably formed of a material having a substantially identical thermal expansion rate to the substrate 10. In the embodiment, the protective substrate 30 is formed of Si, which is an identical material to the substrate 10.

A driving circuit 120 that functions as a signal processing section is fixed to the protective substrate 30. The driving circuit 120 may be a circuit board or a semiconductor integrated circuit (IC), for example. The driving circuit 120 and the lead electrode 90 are electrically coupled through connecting wiring 121 formed of a conductive wire, such as a bonding wire, inserted into the through hole 33. The driving circuit 120 can be electrically coupled with a printer controller 200 (see FIG. 1). Such a driving circuit 120 functions as a controller of a piezoelectric actuator device (piezoelectric element 300).

A compliance substrate 40 including a sealing film and a fixing plate 42 is joined to the protective substrate 30. The sealing film 41 can be formed of a low-rigidity material, and the fixing plate 42 can be formed of a hard material, such as metal. A portion of the fixing plate 42 that faces the manifold 100 is completely removed in the thickness direction (Z direction) to provide an opening 43. One side of the manifold 100 (+Z direction side) is sealed solely by the sealing film 41 having flexibility.

The recording head 1 described above discharges ink droplets through the following operations. First, ink is fed to the recording head from an ink inlet that is connected to an external ink supply mechanism (not shown) to fill the inside of the recording head, i.e., from the manifold 100 to the nozzle openings 21, with ink. Then, in accordance with a recording signal from the driving circuit 120, a voltage is applied between the second electrode 80 and each of the first electrodes 60 corresponding to respective pressure chambers 12, thereby bending and distorting the piezoelectric element 300. This increases the pressure inside the pressure chambers 12 and causes ink droplets to be discharged from the nozzle openings 21.

Piezoelectric Actuator Device

Figure 5:
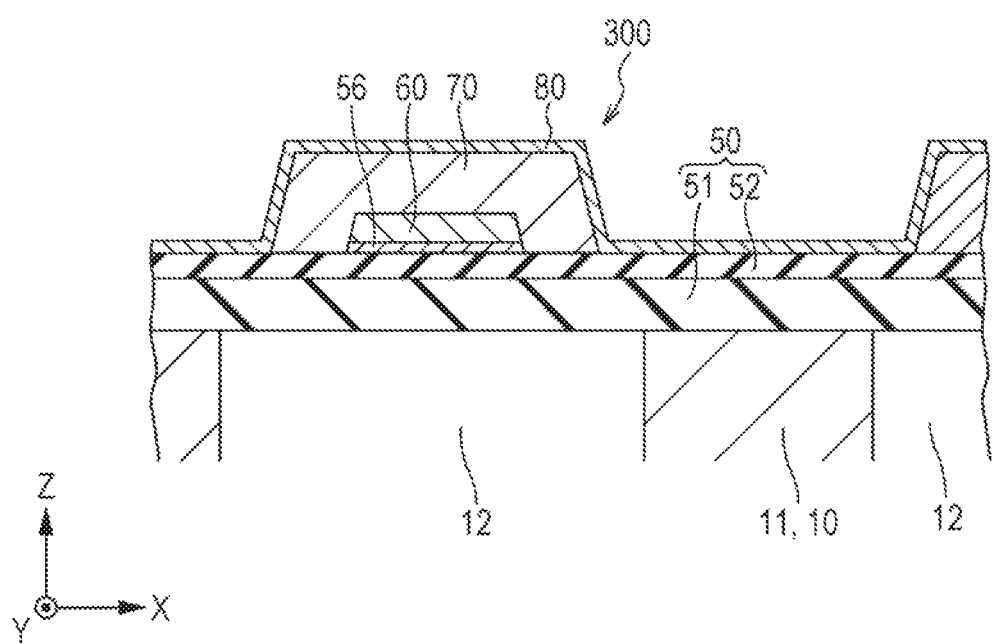
FIG. 5 is an enlarged sectional view taken along line V-V of FIG. 4.

Following, the piezoelectric element 300 employed as a piezoelectric actuator device of the recording head 1 will be described with reference to the drawings. FIG. 5 is an enlarged sectional view taken along line V-V in FIG. 4. As illustrated, the piezoelectric element 300 includes a movable section constituted by forming the diaphragm 50 including the elastic film 51 and the insulator film 52 on the substrate 10 in which the pressure chambers 12 partitioned by a plurality of partition walls 11 have been formed, and successively stacking the bonding layer 56, the first electrodes 60, the piezoelectric layers 70, and the second electrode 80 thereon.

Materials for the first electrode 60 and the second electrode 80 may be any electrode material that can retain conductivity without undergoing oxidation during the formation of the piezoelectric element 300. Examples of such materials include metal, such as platinum (Pt), iridium (Ir), gold (Au), aluminum (Al), copper (Cu), titanium (Ti), silver (Ag), and stainless steel; iridium oxide ($IrO_x$); tin oxide-based conductive materials, such as indium tin oxide (ITO) and fluorine-doped tin oxide (FTO); zinc oxide-based conductive materials, such as gallium-doped zinc oxide (GZO); oxide conductive materials, such as strontium ruthenate ($SrRuO_3$), lanthanum nickel oxide ($LaNiO_3$), and element-doped strontium titanate; and conducting polymers. Among these, noble metals, such as Pt and Ir, are preferred. As the electrode material, any of the above materials may be used alone, or a layered structure of a plurality of materials may be used. Materials for the first electrode 60 and the second electrode 80 may be the same or different.

The piezoelectric layer 70 is formed of a complex oxide (KNN-based complex oxide) having a perovskite structure represented by a general formula of $ABO_3$ ($ABO_3$ perovskite structure) containing potassium (K), sodium (Na), and niobium (Nb). In other words, the piezoelectric layer 70 includes a piezoelectric material formed of a KNN-based complex oxide represented by formula (1) below.

$$(K_x,Na_{1-x})NbO_3 \quad (1)$$

$(0.1 \leq x \leq 0.9)$

The KNN-based complex oxide is a lead-free piezoelectric material with a reduced content of lead (Pb), for example, and thus has excellent biocompatibility and a low environmental load. In addition, the KNN-based complex oxide exhibits excellent piezoelectric characteristics among lead-free piezoelectric materials and thus is advantageous for enhancing various characteristics. Further, the KNN-based complex oxide has a Curie temperature relatively higher than other lead-free piezoelectric materials (for example, BNT-BKT-BT; $[(Bi,Na)TiO_3]$—$[(Bi,K)TiO_3]$—$[BaTiO_3]$) and is less susceptible to depolarization due to an increase in temperature. Consequently, the use of the complex oxide at a high temperature is possible.

In formula (1), the content of K is preferably 30 mol % or more and 70 mol % or less, based on the total amount of metal elements occupying the A site (in other words, the content of Na is 30 mol % or more and 70 mol % or less, based on the total amount of metal elements occupying the A site). This means that formula (1) preferably satisfies $0.3 \leq x \leq 0.7$. Such a range enables the complex oxide to have a composition advantageous to the piezoelectric characteristics. Moreover, the content of K is more preferably 35 mol % or more and 55 mol % or less, based on the total amount of metal elements occupying the A site (in other words, the content of Na is 45 mol % or more and 65 mol % or less, based on the total amount of metal elements occupying the A site). This means that formula (1) more preferably satisfies $0.35 \leq x \leq 0.55$. Such a range enables the complex oxide to have a composition more advantageous to the piezoelectric characteristics.

A piezoelectric material that forms the piezoelectric layer 70 may be any KNN-based complex oxide and is not limited to the composition represented by formula (1). For example, other metal elements (additives) may be contained in the A site and/or the B site of potassium sodium niobate. Examples of the additives include manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn), and copper (Cu).

One or more such additives may be contained. The amount of such additives is typically 20% or less, preferably 15% or less, and more preferably 10% or less, based on the total amount of main component elements. The use of the additives enhances various characteristics, thereby facilitating diversification of the configuration and/or the function. KNN is, however, preferably present in more than 80% in order to exhibit the characteristics originated from KNN. Even when the complex oxide contains such other elements, the complex oxide preferably has the $ABO_3$ perovskite structure.

In the embodiment, the B site of the KNN-based complex oxide preferably further contains Mn. In this case, the content of Mn is preferably 0.2 mol % to 2.0 mol % and more preferably 0.3 mol % to 0.5 mol % when the amount of KNN is set to 100 mol % in the stoichiometric composition. Such a content can facilitate reduction in leakage current, and thus realize a highly reliable piezoelectric element 300 using a lead-free material.

Alkali metals in the A site may be added in excess, relative to the stoichiometric composition. Alternatively, alkali metals in the A site may be deficient, relative to the stoichiometric composition. Accordingly, the complex oxide of the embodiment can also be represented by formula (2).

$$(K_{Ax}, Na_{A(1-x)})NbO_3 \qquad (2)$$

($0.1 \leq x \leq 0.9$, preferably $0.3 \leq x \leq 0.7$, more preferably $0.35 \leq x \leq 0.55$)

In formula (2), A represents the amount of K and Na, which may be added in excess or may be deficient. When the amount of K and Na is in excess, $1.0<A$ is satisfied. When the amount of K and Na is deficient, $A<1.0$ is satisfied. For example, $A=1.1$ represents the content of K and Na is 110 mol %, provided that the amount of K and Na is set to 100 mol % in the stoichiometric composition. Meanwhile, $A=0.9$ represents the content of K and Na is 90 mol %, provided that the amount of K and Na is set to 100 mol % in the stoichiometric composition. When alkali metals in the A site is neither in excess nor deficient, relative to the stoichiometric composition, $A=1$ is satisfied. In order to enhance the characteristics, A satisfies $0.80 \leq A \leq 1.20$, preferably $0.90 \leq A \leq 1.15$, and more preferably $0.95 \leq A \leq 1.10$.

Examples of piezoelectric materials include a material having a composition with a partially deficient element, a material having a composition with a partially excessive element, and a material having a composition with an element partially replaced with another element. Provided the basic characteristics of the piezoelectric layer 70 are unchanged, the piezoelectric materials according to the embodiment also include a material with a non-stoichiometric composition due to a deficiency and/or an excess, as well as a material whose element is partially replaced with another element.

In the specification, "a complex oxide having an $ABO_3$ perovskite structure containing K, Na, and Nb" is not limited to a complex oxide having an $ABO_3$ perovskite structure containing K, Na, and Nb. In other words, such a complex oxide also includes a piezoelectric material represented as a mixed crystal of a complex oxide having an $ABO_3$ perovskite structure containing K, Na, and Nb (KNN-based complex oxide illustrated above, for example) and another complex oxide having an $ABO_3$ perovskite structure.

Another complex oxide is preferably, but not particularly limited to, a lead (Pb)-free piezoelectric material in order to reduce an environmental load. Examples of the lead (Pb)-free piezoelectric material include a perovskite complex oxide, such as a bismuth (Bi)- and iron (Fe)-containing bismuth ferrite (BFO)-based complex oxide; a Bi-, barium (Ba)-, Fe-, and Ti-containing bismuth ferrite-barium titanate (BF-BT)-based complex oxide; a Bi-, Fe-, manganese (Mn)-, Ba-, and Ti-containing bismuth iron manganese oxide-barium titanate (BFM-BT)-based complex oxide; a Bi-, Fe-, and tantalum (Ta)-containing bismuth iron tantalum oxide (BFT). Depending on the applications, another complex oxide may be a lead (Pb)- and bismuth (Bi)-free piezoelectric material. Such materials enable a piezoelectric element 300 to have excellent biocompatibility and a low environmental load.

The piezoelectric element 300 preferably has a thickness of the elastic film 51 of 0.1 μm or more and 2.0 μm or less, a thickness of the insulator film 52 of 0.01 μm or more and 1.0 μm or less, a thickness of the bonding layer 56 of 0.005 μm or more and 0.1 μm or less, a thickness of the first electrode 60 of 0.01 μm or more and 1.0 μm or less, a thickness of the piezoelectric layer 70 of 0.1 μm or more and 3.0 μm or less, a thickness of the second electrode 80 of 0.01 μm or more and 1.0 μm or less. When a seed layer is formed, a thickness of the seed layer is set to 0.08 μm or less, and preferably 0.01 μm or more and 0.05 μm or less. All of the thicknesses mentioned above are examples and can be changed without departing from the spirit of the invention.

The piezoelectric layer 70 is a layered structure of a plurality of piezoelectric films 74 (see FIG. 8), and each of the piezoelectric films 74 contains K, Na, and Nb. In other words, the piezoelectric films 74 are composed of the above-mentioned KNN-based complex oxide, and specifically, KNN films formed of KNN crystals (prepared by removing extraneous materials, such as a solvent, from a precursor solution for the KNN-based complex oxide, and heat-treating to crystallize) having a predetermined preferred orientation through crystallization.

The Na concentration in the piezoelectric layer 70 has a Na local maximum value, which is a local maximum value of the Na concentration, in a first piezoelectric film formed immediately above the first electrode 60, which is among a plurality of piezoelectric films 74, in the vicinity of the first electrode 60; a Na concentration gradient decreasing from the Na local maximum value toward the second electrode 80; and a Na local minimum value, which is a local minimum value of the Na concentration, near a boundary between the first piezoelectric film and a second piezoelectric film formed immediately above the first piezoelectric film. In this case, an intensity ratio of the Na local maximum value to the Na local minimum value (Na local maximum value/Na local minimum value) in the secondary ion mass spectrometry (SIMS) is 1.05 or higher, and preferably the intensity ratio of the Na local maximum value to the Na local minimum value (Na local maximum value/Na local minimum value) in the SIMS is 1.05 or higher and 1.6 or lower in order to enhance the orientation. Meanwhile, the Na minimum value may present in either the first piezoelectric film or the second piezoelectric film. The SIMS will be described in detail in Examples of the invention.

Meanwhile, the K concentration in the piezoelectric layer 70 has a K local maximum value, which is a local maximum value of the K concentration, near the boundary between the first piezoelectric film and the second piezoelectric film, and a K concentration gradient decreasing from the K local maximum value toward the first electrode 60. In this case, when a value at an inflection point of the K concentration near the boundary between the first piezoelectric film and the first electrode 60 is set to be a K inflection value, an intensity ratio of the K local maximum value to the K inflection value (K local maximum value/K inflection value) in the SIMS is 1.15 or higher. Preferably, the intensity ratio of the K local maximum value to the K inflection value (K local maximum value/K inflection value) in the SIMS is 1.15 or higher and 2.0 or lower in order to enhance the orientation. The K local maximum value may present in either the first piezoelectric film or the second piezoelectric film.

In the embodiment, predetermined Na and K concentration gradients in the piezoelectric layer 70 enable the crystals of the piezoelectric body in the piezoelectric layer 70 to have the (100) preferred orientation.

The piezoelectric layer 70 composed of piezoelectric films 74 (KNN films) having the (100) preferred orientation herein refers to KNN crystals having the (100) preferred orientation in the embodiment. For example, since Na and K in the lowermost piezoelectric film (first piezoelectric film) each have a predetermined concentration gradient, the piezoelectric layer 70 formed of a KNN-based complex oxide has the (100) preferred orientation. The piezoelectric layer 70 may have the (110) or (111) preferred orientation, depending on piezoelectric materials and/or manufacturing methods for a seed layer that is provided as needed, for example. Various characteristics of the piezoelectric layer 70 having the (100) preferred orientation, however, are enhanced more readily than a piezoelectric layer having the random orientation or another preferred orientation.

In the specification, the preferred orientation indicates that 50% or more, preferably 80% or more of crystals have a predetermined crystal orientation. For example, "having the (100) preferred orientation" includes a case in which all the crystals in the piezoelectric layer 70 have the (100) preferred orientation, and a case in which more than half of the crystals (50% or more, preferably 80% or more) have the (100) preferred orientation.

Method of Manufacturing Piezoelectric Element

Following, an exemplary method of manufacturing the piezoelectric element 300, and a method of manufacturing a recording head 1 will be described with reference to the drawings. FIGS. 6 to 12 are sectional views illustrating an example of manufacturing an ink jet recording head.

Figure 6:
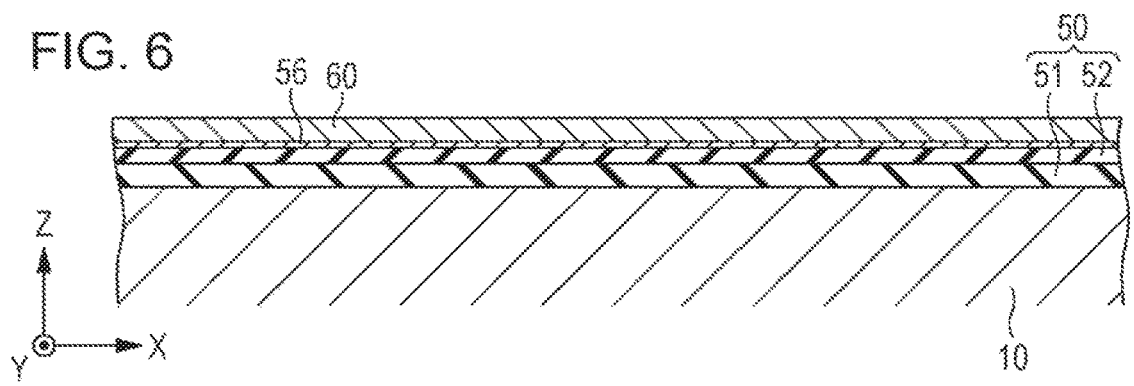
FIG. 6 is a sectional view illustrating an example of manufacturing the ink jet recording head.

First, as illustrated in FIG. 6, a Si single crystal substrate is prepared as the substrate 10. Next, the elastic film 51 of $SiO_2$ is formed on the surface of the substrate 10 by thermal oxidation. Further, a Zr film is formed on the elastic film 51 by sputtering or vapor deposition, for example, and then thermally oxidized to yield the insulator film 52 of $ZrO_2$. As described above, the diaphragm 50 including the elastic film 51 and the insulator film 52 is formed on the substrate 10. Subsequently, the bonding layer 56 of $TiO_x$ is formed on the insulator film 52. The bonding layer 56 can be formed by sputtering or thermal oxidation of a Ti film, for example. The first electrode 60 of Pt is then formed on the bonding layer 56. In accordance with electrode materials, the first electrode 60 can be formed by vapor-phase film formation, such as sputtering, vacuum vapor deposition (PVD), or laser ablation; or by liquid-phase film formation, such as spin coating.

Figure 7:
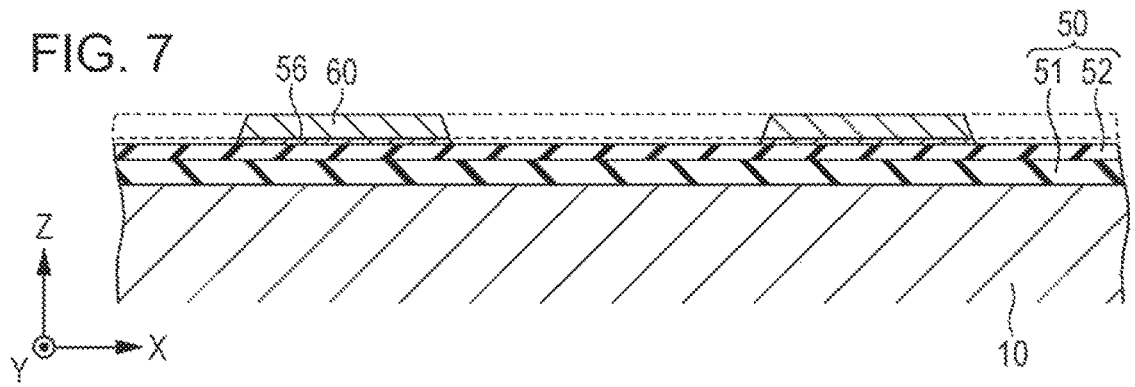
FIG. 7 is a sectional view illustrating the example of manufacturing the ink jet recording head.

Subsequently, as illustrated in FIG. 7, a resist (not shown) of a predetermined shape is formed as a mask on the first electrode 60, and the bonding layer 56 and the first electrode 60 are simultaneously patterned. Such patterning of the bonding layer 56 and the first electrode 60 can be performed by, for example, dry etching, such as reactive ion etching (RIE) or ion milling; or wet etching using an etchant. The shapes of the bonding layer 56 and the first electrode 60 in patterning are not particularly limited.

Figure 8:
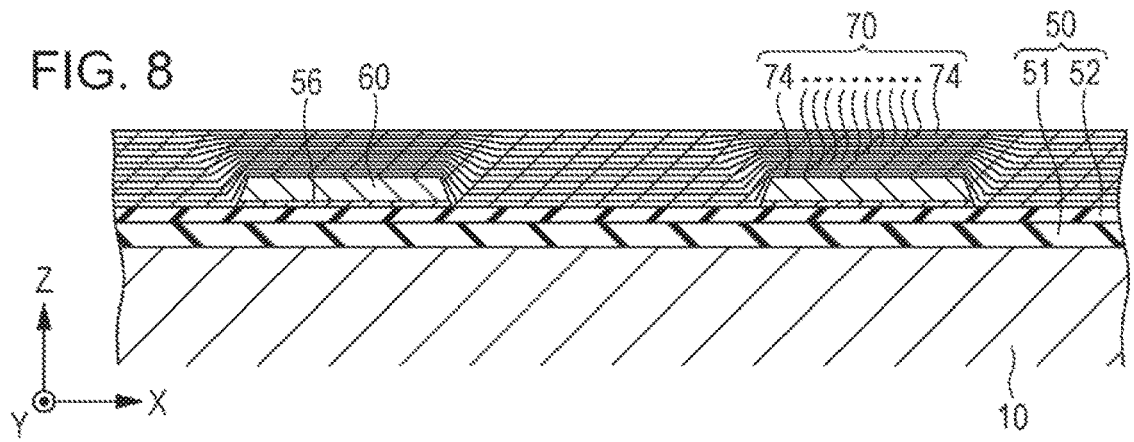
FIG. 8 is a sectional view illustrating the example of manufacturing the ink jet recording head.

As illustrated in FIG. 8, layers of piezoelectric films 74 are formed on the first electrode 60. The piezoelectric layer 70 is composed of the layers of piezoelectric films 74. The piezoelectric layer 70 can be formed by, for example, a chemical solution method (wet method) in which a metal oxide is obtained by applying and drying a metal complex solution (precursor solution) and firing at a high temperature. The piezoelectric layer 70 can also be formed by laser ablation, sputtering, pulsed laser deposition (PLD), chemical vapor deposition (CVD), or aerosol deposition, for example. In the embodiment, a wet method (liquid-phase method) is employed because of easy compositional adjustment in the method.

The wet method (liquid-phase method) herein refers to a film forming method through a chemical solution method, such as MOD or sol-gel processing, and is a concept distinguished from a vapor-phase method, such as sputtering. In the embodiment, a vapor-phase method may also be employed provided that the (100)-oriented piezoelectric layer 70 can be formed.

Although the details will be described hereinafter, the piezoelectric layer 70 formed by a wet method (liquid-phase method) includes layers of the piezoelectric films 74 that are formed through a series of steps including: forming a precursor film by applying a precursor solution (coating step); drying the precursor film (drying step); degreasing the dried precursor film by heating (degreasing step); and firing the degreased precursor film (firing step). The piezoelectric layer 70 is thus formed by repeating the series of steps from the coating step to the firing step a plurality of times. In the above series of steps, the firing step may be performed after repeating the steps from the coating step to the degreasing step a plurality of times.

A layer or a film formed by a wet method has an interface. Coating or firing marks remain in a layer or a film formed by a wet method. Such marks are interfaces confirmable through observing the cross-section and analyzing an elemental concentration distribution within the layer (or within the film). Strictly speaking, an interface indicates a boundary between layers or films. Herein, however, "interface" indicates the vicinity of the boundary between layers or films. When a cross-section of a layer or a film formed by a wet method is observed, for example, by using an electron microscope, such an interface is confirmed, near the boundary with an adjacent layer or film, as a portion with a darker color or a lighter color compared with the other portions. When an elemental concentration distribution is analyzed, such an interface is confirmed, near the boundary with an adjacent layer or film, as a portion with a higher elemental concentration or a lower elemental concentration compared with the other portions. The piezoelectric layer 70 is formed by repeating the series of steps from the coating step to the firing step a plurality of times; or repeating the steps from the coating step to the degreasing step a plurality of times, followed by the firing step (piezoelectric layer 70 is composed of a plurality of piezoelectric films 74). Accordingly, the piezoelectric layer 70 has a plurality of interfaces corresponding to respective piezoelectric films 74.

An example of a specific procedure of forming the piezoelectric layer 70 by a wet method is as follows. First, each precursor solution for forming the piezoelectric layer 70, such as a metal complex-containing MOD solution or sol, is prepared (preparation step). The precursor solution for the piezoelectric layer 70 is applied on the patterned first electrode 60 by spin coating, for example, to form a precursor film (coating step). Subsequently, the precursor film is heated to a predetermined temperature, such as about 130° C. to about 250° C., dried for a certain period of time (drying step), and degreased by further heating the dried precursor film to a predetermined temperature, such as about 300° C. to about 450° C., and maintaining for a certain period of time (degreasing step). The degreased precursor film is then heated to a higher temperature, such as about 500° C. to about 800° C., and crystallized by being maintained at a temperature in the range for a certain period of time, thereby forming a piezoelectric film 74 (firing step). By repeating the coating step, the drying step, the degreasing step, and the firing step a plurality of times after forming the piezoelectric film 74, the piezoelectric layer 70 including a plurality of piezoelectric films 74 is formed.

In the above-mentioned precursor solution, a metal complex that can form a KNN-based complex oxide by firing is dissolved or dispersed in an organic solvent. This means that the precursor solution for the piezoelectric layer 70 contains predetermined elements (K, Na, and Nb in the embodiment) as central metals of metal complexes. A metal complex containing an element excluding the predetermined elements may be further mixed with the precursor solution for the piezoelectric layer 70.

As the metal complexes containing the above predetermined elements, alkoxides, organic acid salts, and β-diketone complexes, for example, can be used. In the above-described precursor solutions, the metal complexes may be mixed at a mixing ratio such that the predetermined elements included in the KNN-based complex oxide satisfies a desired molar ratio.

Examples of K-containing metal complexes include potassium 2-ethylhexanoate and potassium acetate. Examples of Na-containing metal complexes include sodium 2-ethylhexanoate and sodium acetate. Examples of Nb-containing metal complexes include niobium 2-ethylhexanoate and pentaethoxyniobium. When Mn is added as an additive, examples of Mn-containing metal complexes include manganese 2-ethylhexanoate. In the above examples, two or more metal complexes may be used together. For example, potassium 2-ethylhexanoate and potassium acetate may be used together as K-containing metal complexes.

Examples of organic solvents used for preparation of the precursor solutions include propanol, butanol, pentanol, hexanol, octanol, ethylene glycol, propylene glycol, octane, decane, cyclohexane, xylene, toluene, tetrahydrofuran, acetic acid, 2-ethylhexanoic acid, 2-n-butoxyethanol, n-octane, and mixed solvents thereof. The precursor solution may contain an additive for stabilizing the dispersion of each metal complex. Examples of the additives include 2-ethylhexanoic acid and diethanolamine.

Heating apparatuses used in the drying step, the degreasing step, and the firing step include, for example, a hot plate and a rapid thermal annealing (RTA) apparatus that performs heating by irradiation with an infrared lamp.

Figure 9:
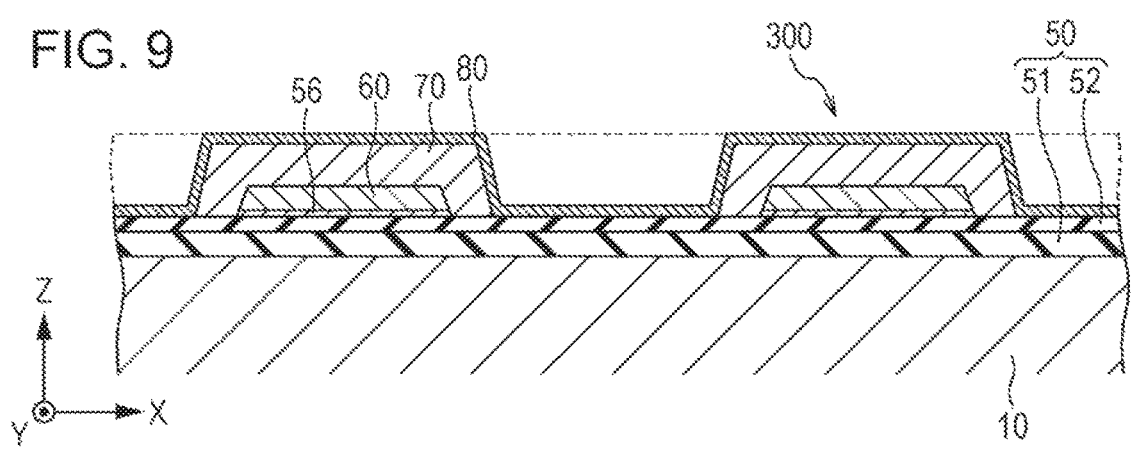
FIG. 9 is a sectional view illustrating the example of manufacturing the ink jet recording head.

As illustrated in FIG. 9, the piezoelectric layer 70 is then patterned. Such patterning can be performed by dry etching, such as reactive ion etching or ion milling; or wet etching using an etchant. The shape of the piezoelectric layer 70 in patterning is not particularly limited. Subsequently, the second electrode 80 is formed on the patterned piezoelectric layer 70. The second electrode 80 can be formed by a method similar to the method by which the first electrode 60 is formed.

Before or after forming the second electrode 80 on the piezoelectric layer 70, a re-heating process (post-annealing) may be performed as needed in a temperature range of about 600° C. to about 800° C. Through the post-annealing, a good interface can be formed between the bonding layer 56 and the first electrode 60, between the first electrode 60 and the piezoelectric layer 70, and between the piezoelectric layer 70 and the second electrode 80. At the same time, the crystallinity of the piezoelectric layer 70 can be improved.

In the embodiment, the piezoelectric material contains the alkali metals (K and Na). The alkali metals readily diffuse into the first electrode 60 in the firing step. If the alkali metals pass through the first electrode 60 and reach the substrate 10, the alkali metals may react with the substrate 10. In the embodiment, however, the above-mentioned insulator film 52 composed of $ZrO_2$ functions as a barrier against K and Na. Accordingly, the number of the alkali metals that reach the substrate 10, which is a Si substrate, can be reduced.

Figure 10:
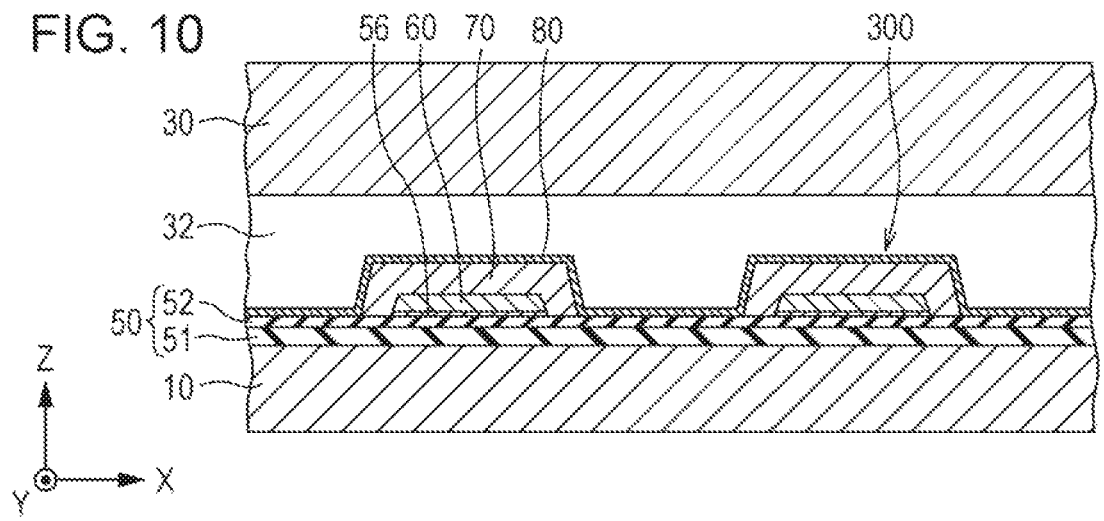
FIG. 10 is a sectional view illustrating the example of manufacturing the ink jet recording head.

Subsequently, although not shown, the lead electrode 90 is formed and simultaneously patterned into a predetermined shape (see FIG. 4). As illustrated in FIG. 10, a protective substrate wafer (not shown), which is a silicon wafer to become a plurality of protective substrates 30, is bonded to the piezoelectric element 300 on the side of a channel-forming substrate wafer (not shown) by using an adhesive 35 (see FIG. 4). Subsequently, the channel-forming substrate wafer is thinned into a predetermined thickness.

Figure 11:
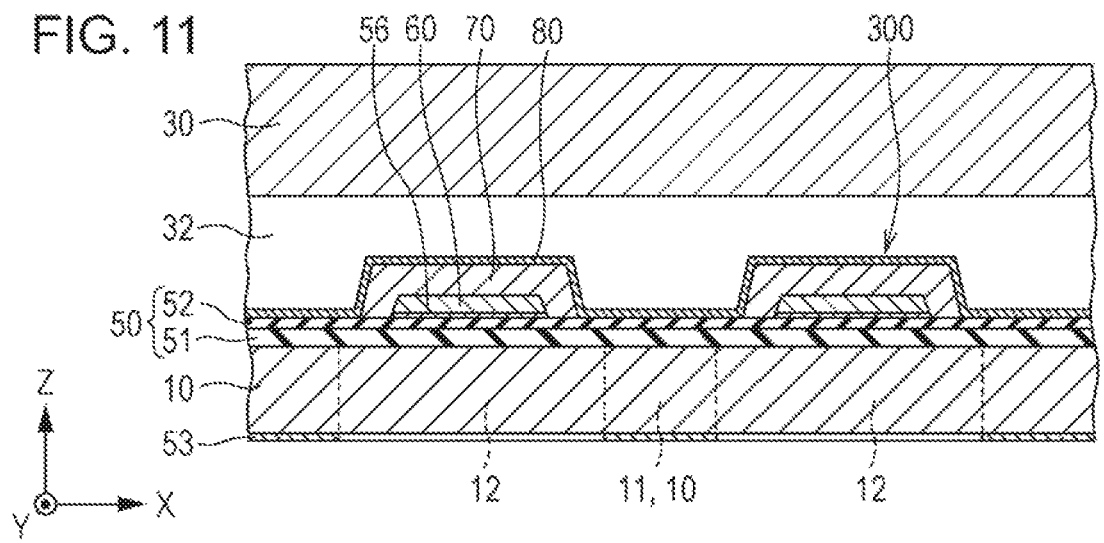
FIG. 11 is a sectional view illustrating the example of manufacturing the ink jet recording head.
Figure 12:
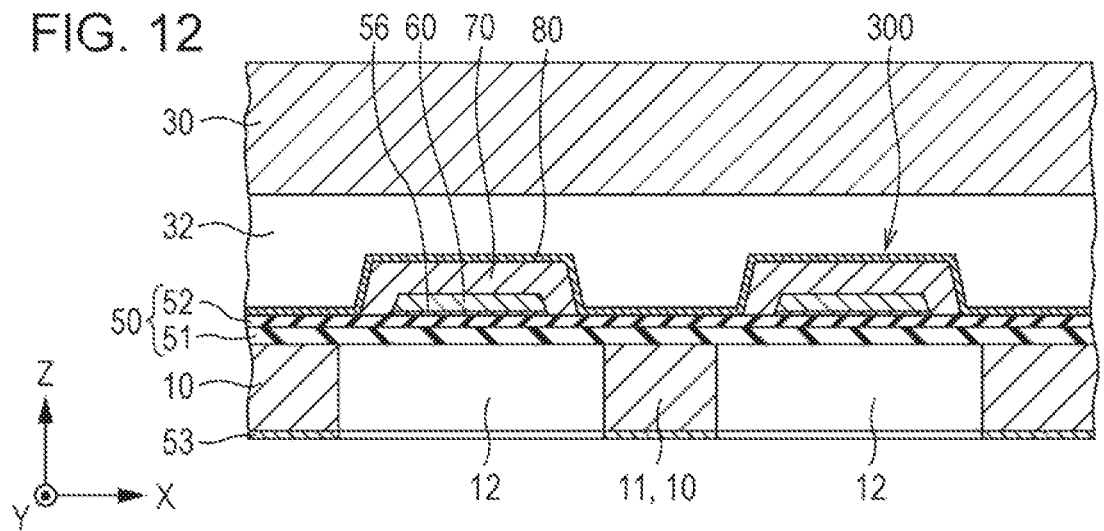
FIG. 12 is a sectional view illustrating the example of manufacturing the ink jet recording head.
Figure 13:
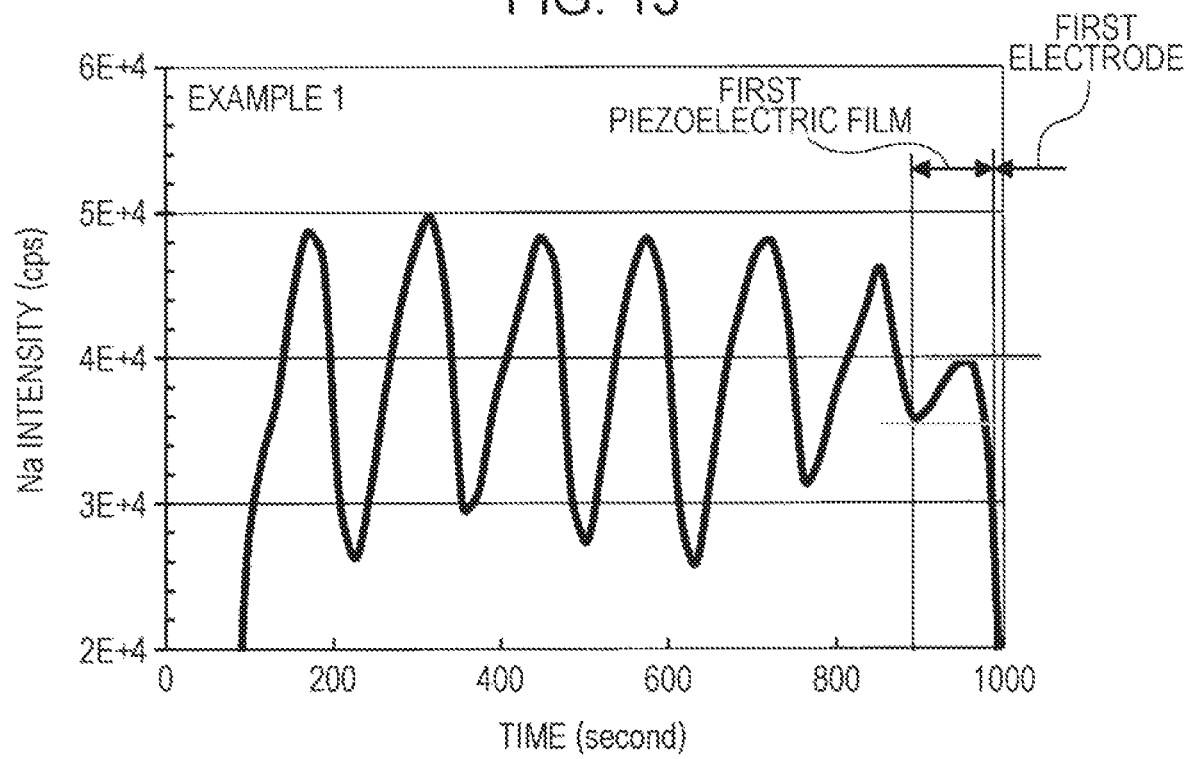
FIG. 13 is a graph indicating the SIMS result for Na in Example 1.
Figure 14:
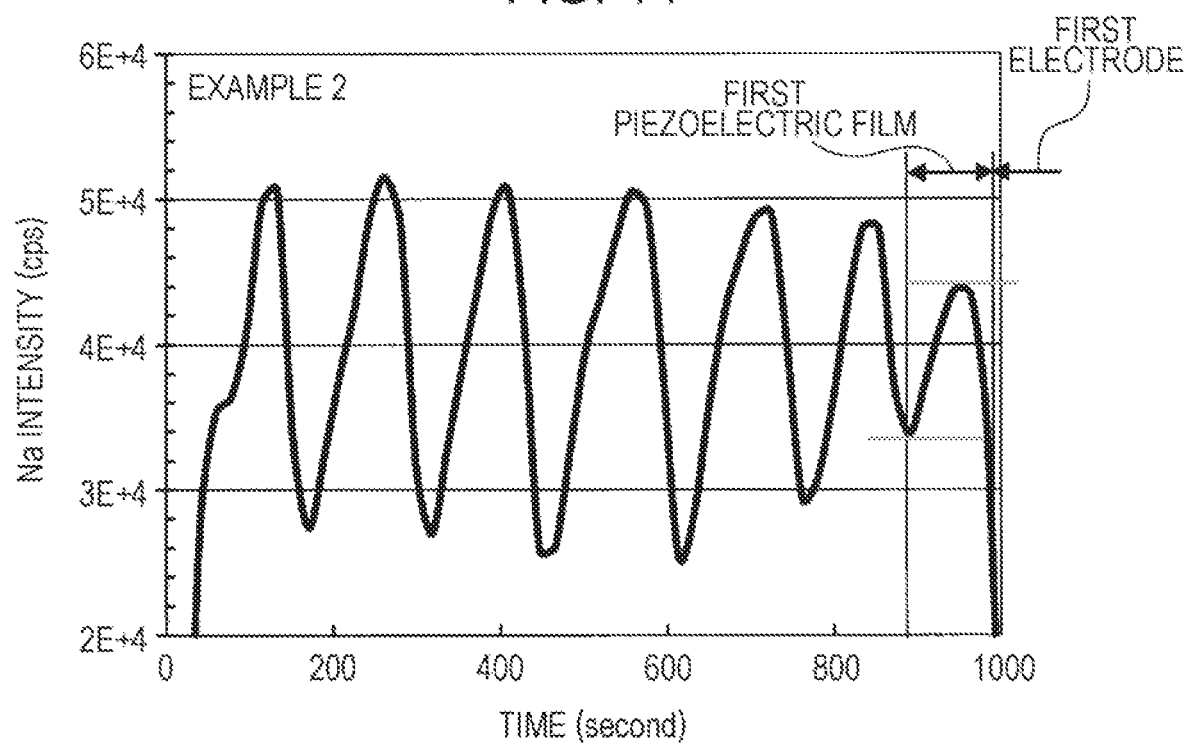
FIG. 14 is a graph indicating the SIMS result for Na in Example 2.
Figure 15:
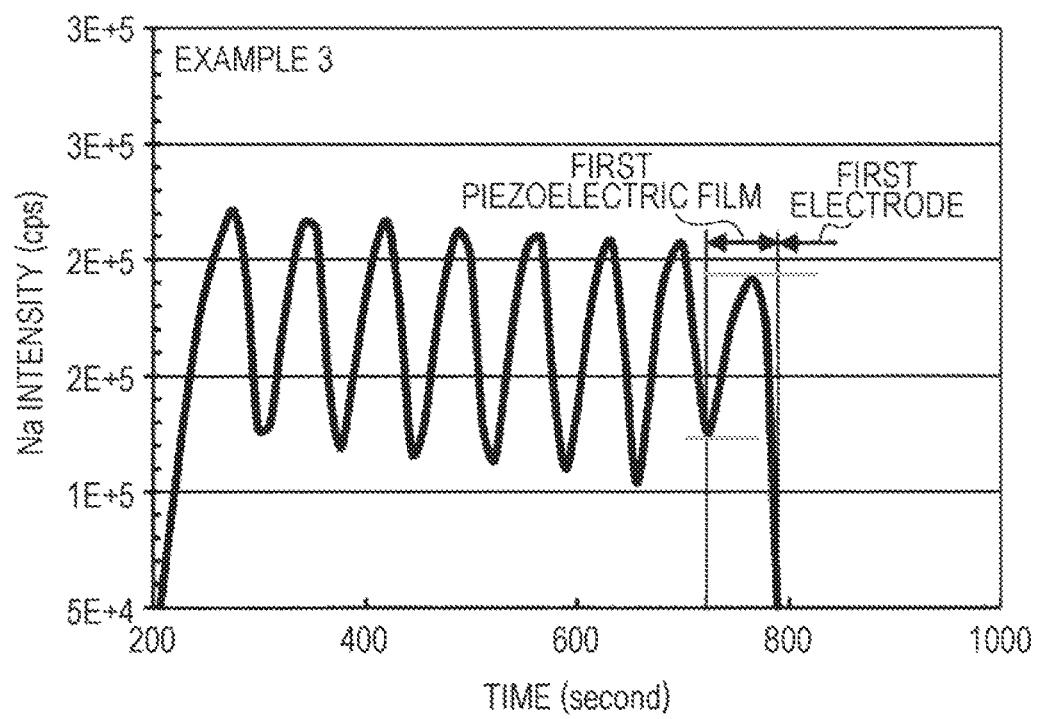
FIG. 15 is a graph indicating the SIMS result for Na in Example 3.
Figure 16:
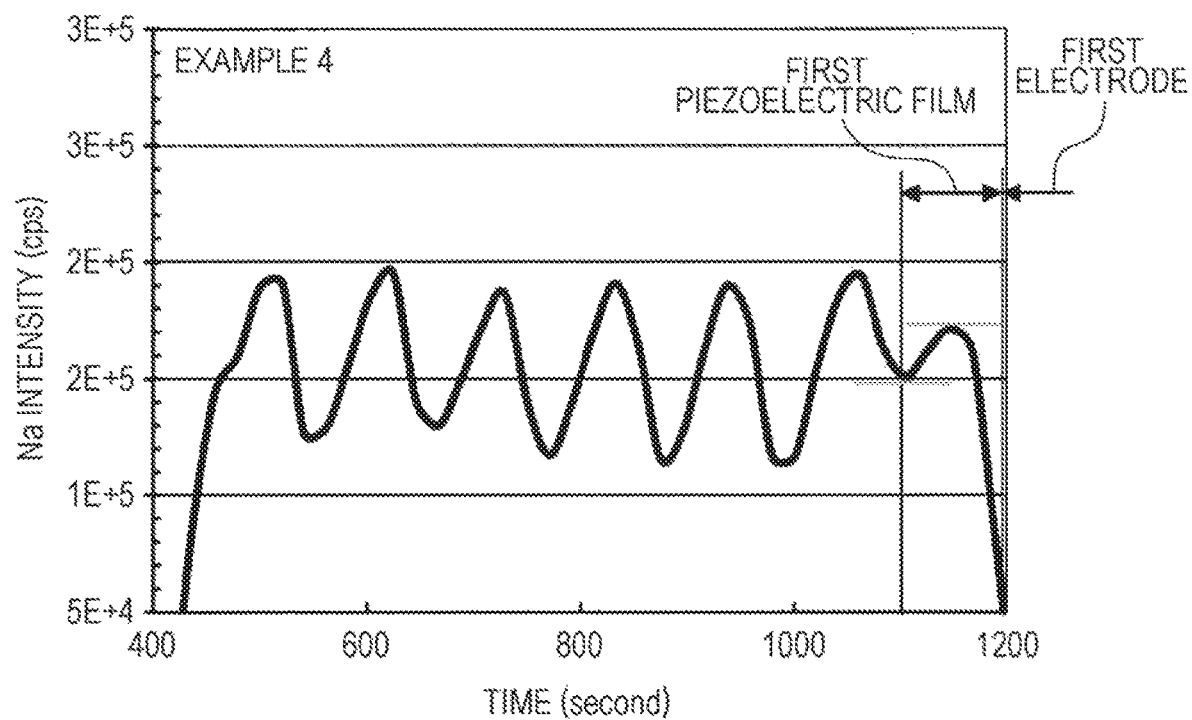
FIG. 16 is a graph indicating the SIMS result for Na in Example 4.
Figure 17:
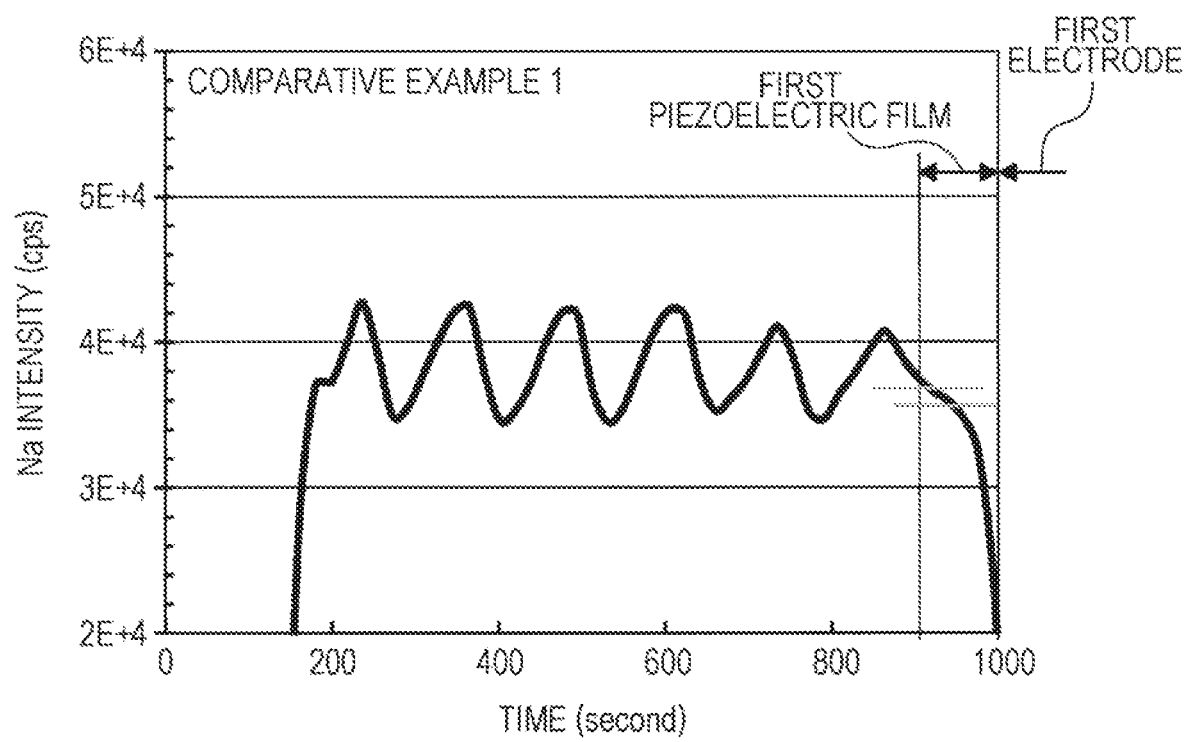
FIG. 17 is a graph indicating the SIMS result for Na in Comparative Example 1.
Figure 18:
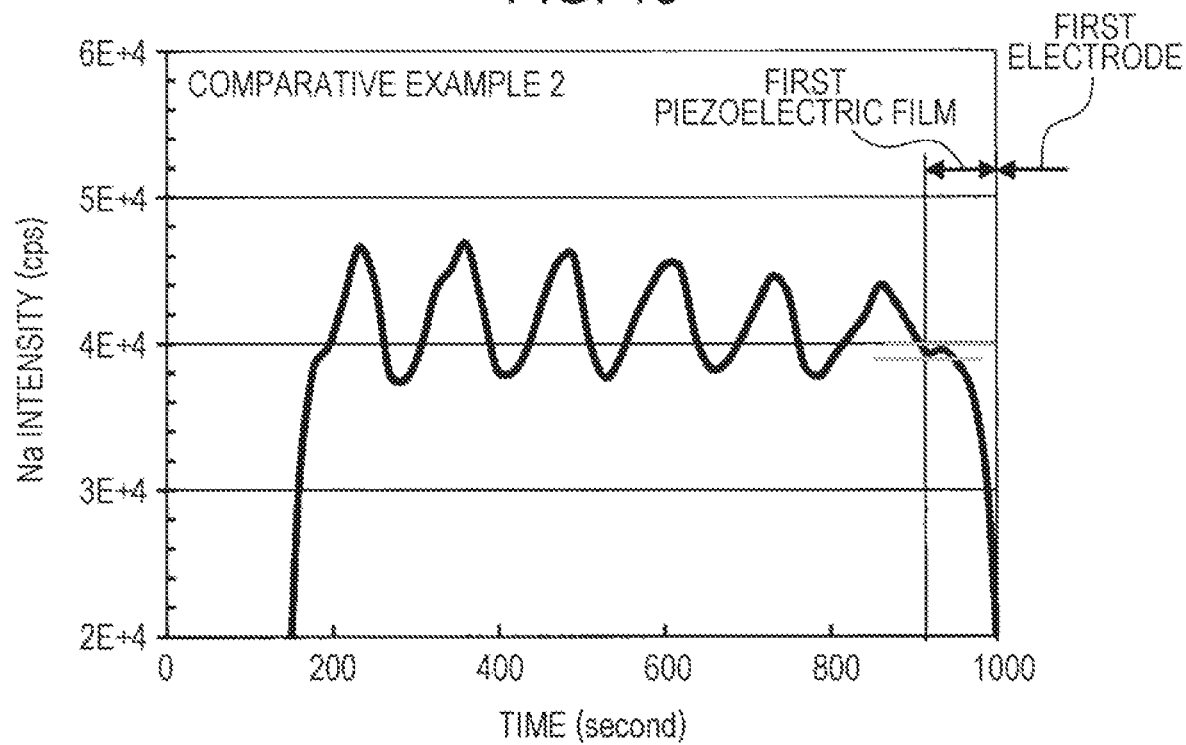
FIG. 18 is a graph indicating the SIMS result for Na in Comparative Example 2.
Figure 19:
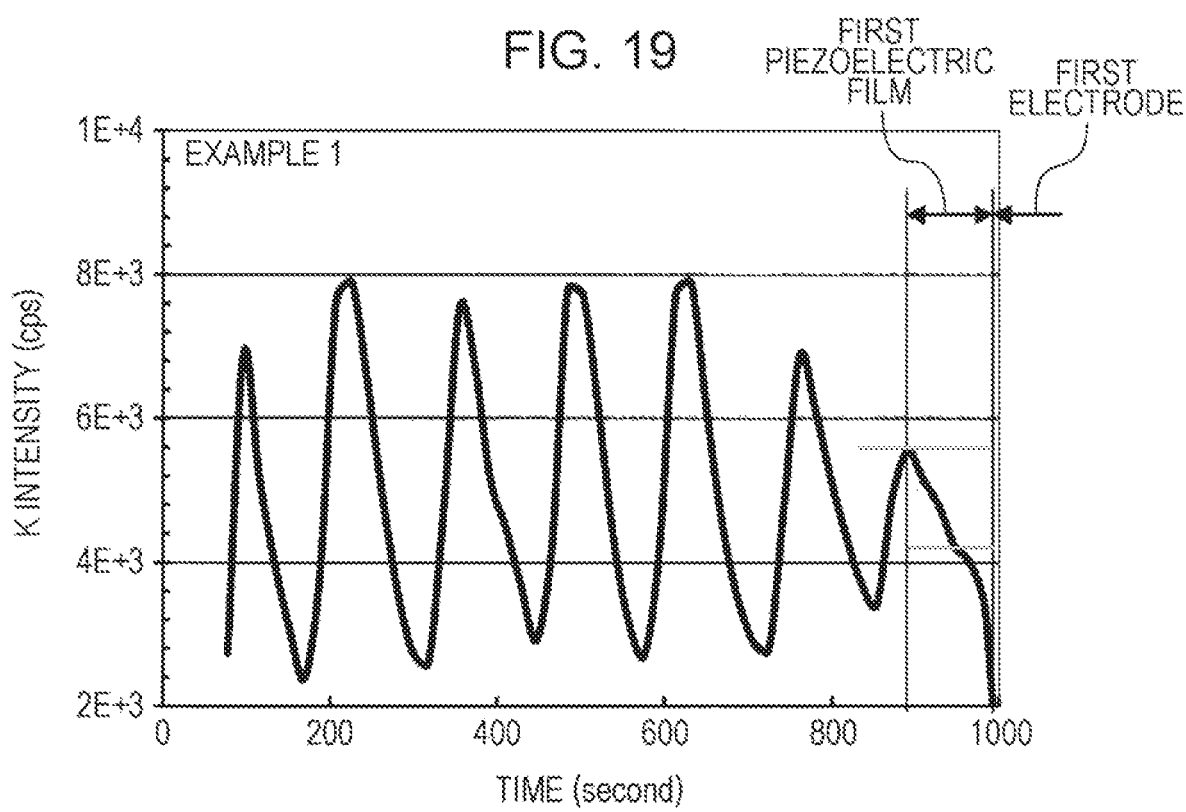
FIG. 19 is a graph indicating the SIMS result for K in Example 1.
Figure 20:
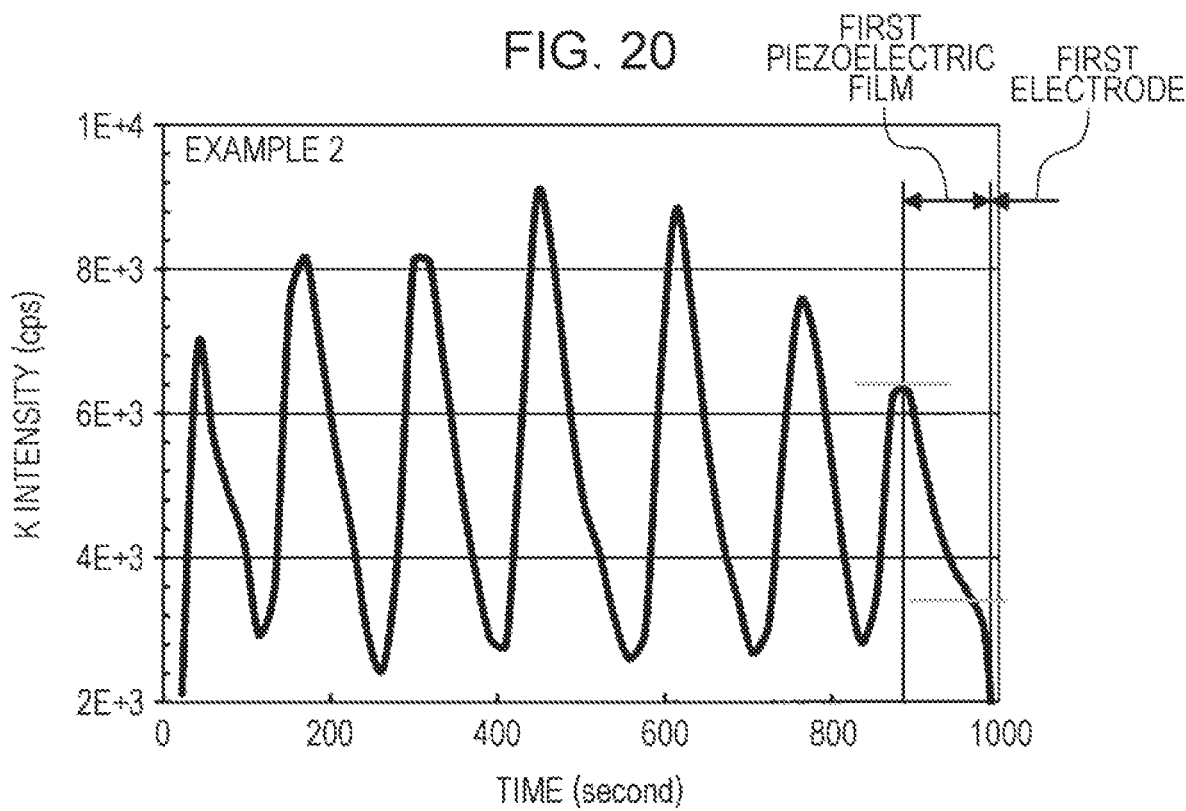
FIG. 20 is a graph indicating the SIMS result for K in Example 2.
Figure 21:
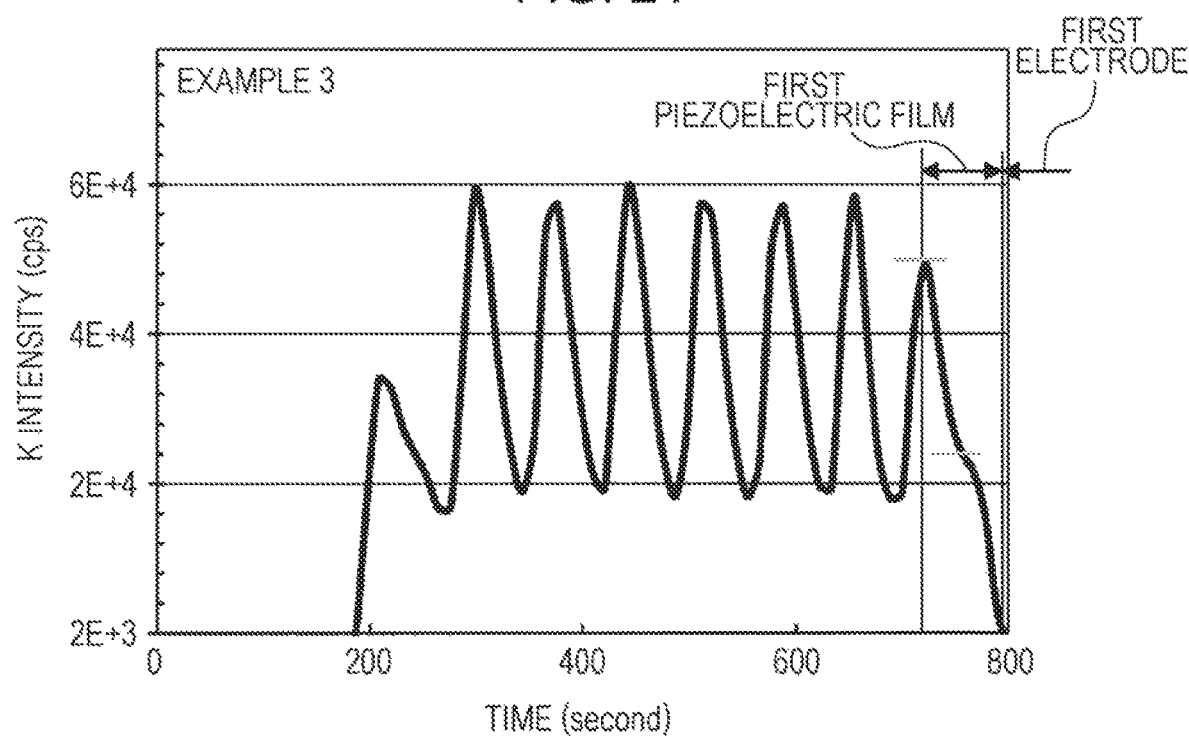
FIG. 21 is a graph indicating the SIMS result for K in Example 3.
Figure 22:
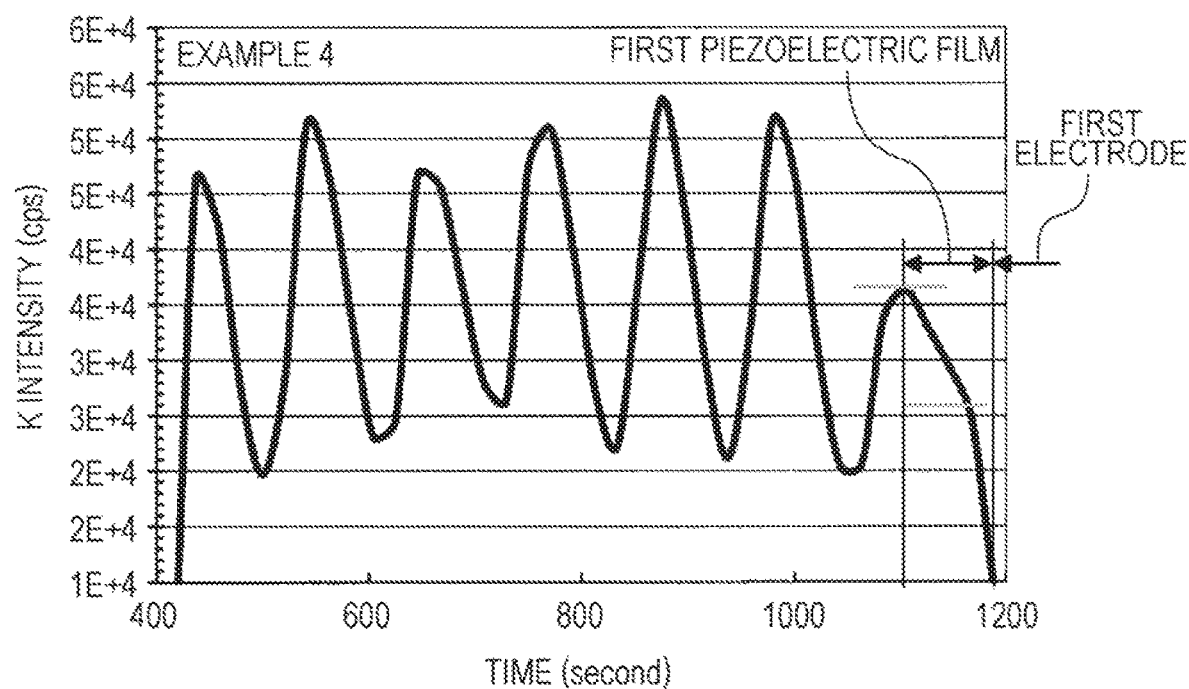
FIG. 22 is a graph indicating the SIMS result for K in Example 4.
Figure 23:
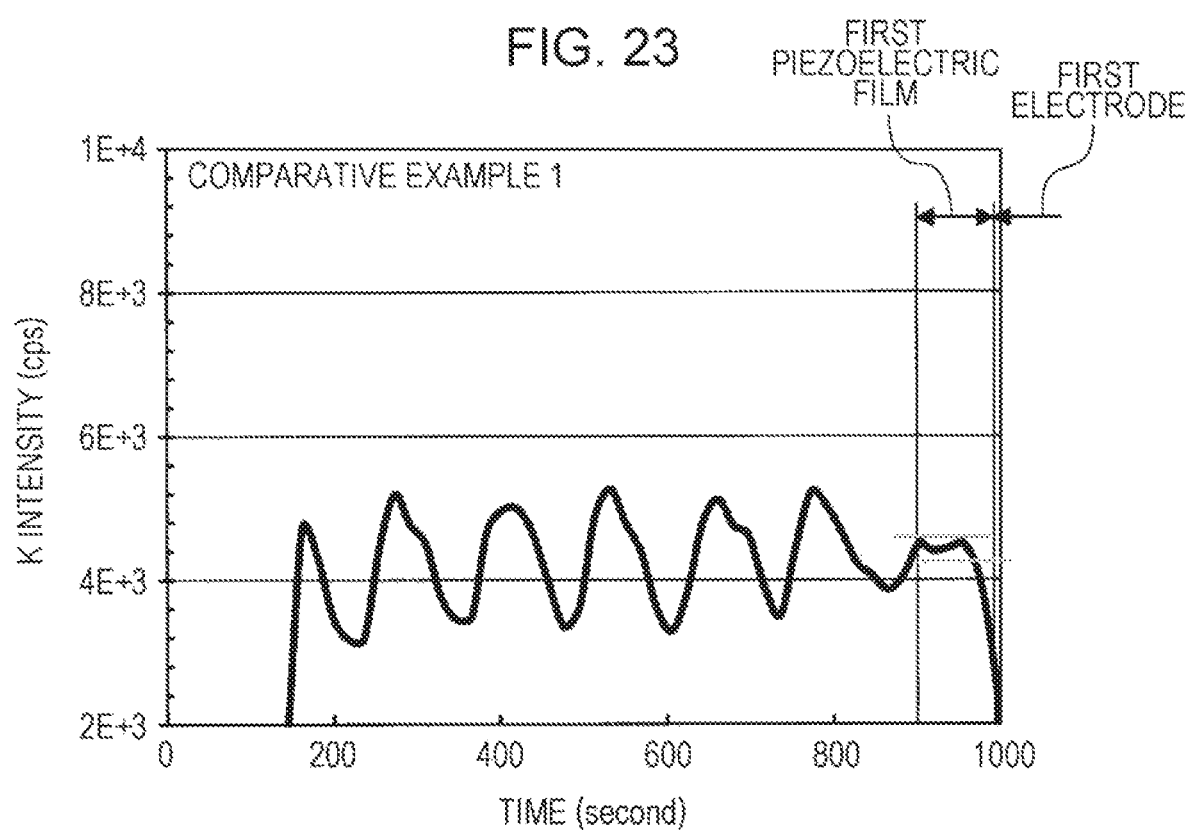
FIG. 23 is a graph indicating the SIMS result for K in Comparative Example 1.
Figure 24:
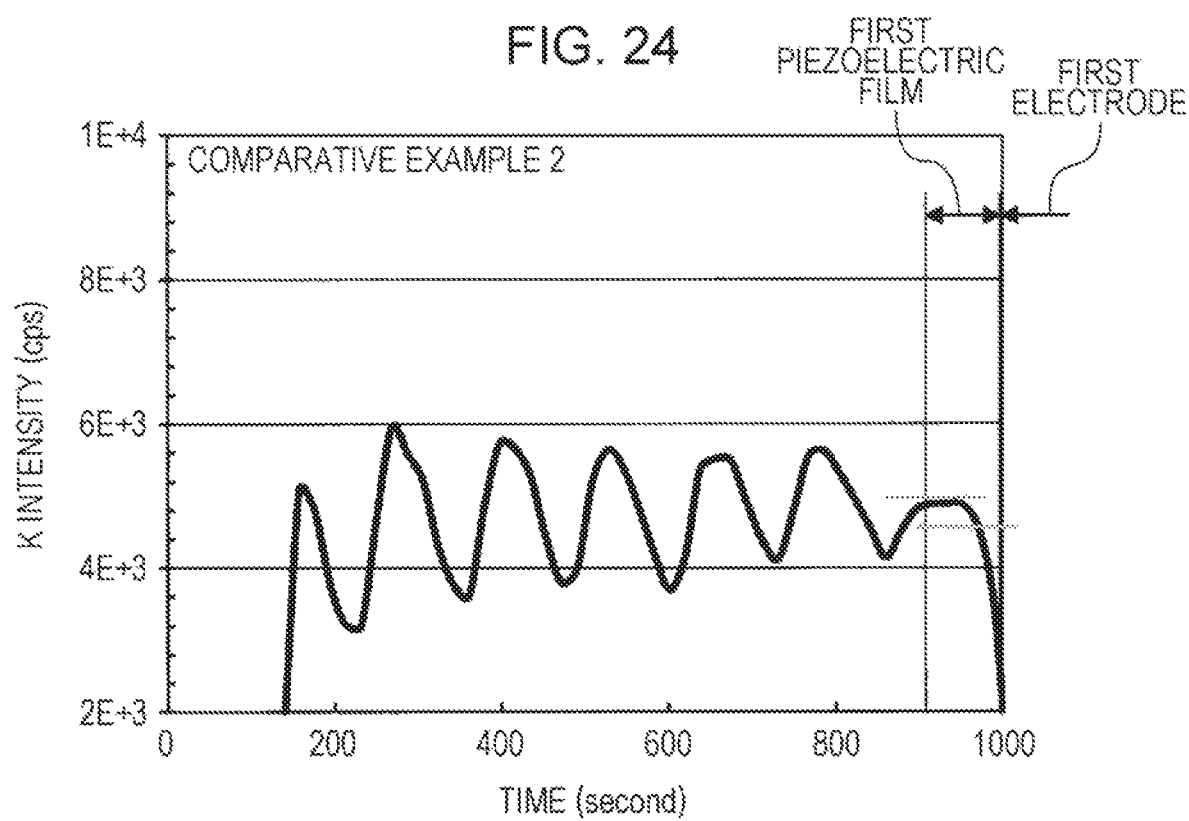
FIG. 24 is a graph indicating the SIMS result for K in Comparative Example 2.

As illustrated in FIG. 11, a mask film 53 is then newly formed on the channel-forming substrate wafer, followed by patterning into a predetermined shape. As illustrated in FIG. 12, through the mask film 53, anisotropic etching (wet etching) using an alkali solution, such as KOH, is performed on the channel-forming substrate wafer, thereby forming pressure chambers 12 corresponding to individual piezoelectric elements 300, the ink supply path 13, the communicating path 14, and the communicating portion 15, for example (see FIG. 4).

Subsequently, unnecessary portions in the outer peripheral edges of the channel-forming substrate wafer and the protective substrate wafer are cut and removed by dicing, for example. Further, the nozzle plate 20, in which nozzle openings 21 are drilled, is joined to the surface of the channel-forming substrate wafer on the side opposite to the protective substrate wafer. The compliance substrate 40 is joined to the protective substrate wafer, and the channel-forming substrate wafer, for example, is divided into the substrates 10 of one chip size, for example, as illustrated in FIG. 2, thereby forming the ink jet recording head (recording head 1) of the embodiment.

EXAMPLES

Following, the present invention will be further specifically described with Examples. The present invention, however, is not limited to the following Examples.

Example 1

First, a 6-inch (100)-plane silicon single crystal substrate (substrate 10) was thermally oxidized to form a $SiO_2$ film (elastic film 51) on a surface of the Si single crystal substrate. On the elastic film 51, a Zr film was formed by sputtering and then thermally oxidized to form a $ZrO_2$ film (insulator film 52), thereby forming a diaphragm 50 composed of the elastic film 51 and the insulator film 52. Subsequently, a Ti layer was formed on the insulator film 52 by sputtering and then thermally oxidized to form a $TiO_x$ layer (bonding layer 56). A Pt electrode film was then formed on the bonding layer 56 by sputtering while heating at 450° C. A predetermined photoresist pattern was then formed on the Pt electrode film, and the Pt electrode film and the $TiO_x$ layer were patterned by ion milling to form a Pt electrode (first electrode 60) in a predetermined shape.

A precursor solution containing potassium 2-ethylhexanoate, sodium 2-ethylhexanoate, niobium 2-ethylhexanoate, and manganese 2-ethylhexanoate was prepared so that a KNN layer (piezoelectric layer 70) formed of a KNN-based complex oxide described hereinafter has the composition of $(K_{0.4}Na_{0.6})(Nb_{0.995}Mn_{0.005})O_3$.

The prepared precursor solution was applied to the above-mentioned substrate 10, where the first electrode 60 was formed, by spin coating at 1,500 rpm to 3,000 rpm (coating step). The substrate 10 was then placed on a hot plate and dried at 180° C. (drying step). Afterwards, the substrate 10 on the hot plate was degreased at 380° C. (degreasing step). Subsequently, a first KNN film (piezoelectric film 74) was formed by increasing the temperature to 700° C. in 10 seconds using a RTA apparatus, and heat-treated at 700° C. for 3 minutes (firing step).

Then, six layers of piezoelectric films 74 were formed by further repeating the above steps from the coating step to the firing step six times. Consequently, a 500 nm-thick piezoelectric layer 70 including seven piezoelectric films was formed.

Example 2

A piezoelectric layer 70 was formed in substantially the same manner as Example 1 except for performing the heat treatment by the RTA apparatus at 650° C. in the firing step.

Example 3

A piezoelectric layer 70 was formed in substantially the same manner as Example 1 except for setting the composition to $(K_{0.424}Na_{0.636})(Nb_{0.995}Mn_{0.005})O_3$ during the preparation of the precursor solution, forming eight layers of piezoelectric films 74, and having the total thickness of 570 nm.

Example 4

A piezoelectric layer 70 was formed in substantially the same manner as Example 3 except for performing the heat treatment by the RTA apparatus at 600° C. in the firing step, forming seven layers of piezoelectric films 74, and having the total thickness of 500 nm.

Comparative Example 1

A piezoelectric layer 70 was formed in substantially the same manner as Example 1 except for setting the time for increasing the temperature to 30 seconds for the heat treatment by the RTA apparatus in the firing step.

Comparative Example 2

A piezoelectric layer 70 was formed in substantially the same manner as Comparative Example 1 except for performing the heat treatment by the RTA apparatus at 600° C. in the firing step.

SIMS Analysis

For each of Examples and Comparative Examples, secondary ion mass spectrometry (SIMS) was performed in the thickness direction of the piezoelectric layer 70 using IMS-7 f (CAMECA, Inc.), and Na and K distribution states in the piezoelectric layer 70 was evaluated. For the measurement, 10 nA $Cs^+$ accelerated to 15 keV was used as the primary ion beam. Positive secondary ions were detected from the center of the raster scan area 33 .mu.m in diameter. The mass resolution ($M/\Delta M$) was set to 5000. In addition, in order to prevent charging up during the SIMS analysis, electron beam irradiation was performed with an electron gun. FIGS. 13 to 18 are graphs each indicating the SIMS result for Na in each of Examples and Comparative Examples, whereas FIGS. 19 to 24 are graphs each indicating the SIMS result for K in each of Examples and Comparative Examples. In each graph, the horizontal axis represents sputtering time (second), and the time elapsed corresponds to the depth in the thickness direction of the piezoelectric layer 70. This means that states of Na and K in deeper points from the piezoelectric layer 70 toward the first electrode 60 are evaluated toward the right side of the horizontal axis on the plane of each graph.

As shown in FIGS. 13 to 16, the Na concentration in the piezoelectric layer 70 of each Example exhibited characteristic distribution state in a piezoelectric film 74 (first piezoelectric film) on the side of the first electrode 60. In other words, the Na concentration in the piezoelectric layer 70 had a Na local maximum value, which is a local maximum value of the Na concentration, in the first piezoelectric film, which is among a plurality of piezoelectric films 74, in the vicinity of the first electrode 60; a gradient decreasing from the Na local maximum value toward a piezoelectric film 74 (second piezoelectric film) formed immediately above the first piezoelectric film; and a Na local minimum value, which is a local minimum value of the Na concentration, near a boundary between the first piezoelectric film and the second piezoelectric film.

Table 1 shows an intensity ratio of the Na local maximum value to the Na local minimum value (Na local maximum value/Na local minimum value) calculated from the SIMS result for each Example. As shown in Table 1, the Na ratio (Na local maximum value/Na local minimum value) for each Example was within the range of 1.05 or higher and 1.6 or lower.

Table 1 also shows the Na ratio (Na local maximum value/Na local minimum value) calculated from the SIMS result for each Comparative Example. As shown in Table 1, the Na ratio (Na local maximum value/Na local minimum value) for each Comparative Example was smaller than those of the Examples.

TABLE 1

|  | Na Local Maximum Value (cps) | Na Local Minimum Value (cps) | Na Local Maximum Value/Na Local Minimum Value |
|---|---|---|---|
| Example 1 | 3.96E+04 | 3.64E+04 | 1.09 |
| Example 2 | 4.38E+04 | 3.39E+04 | 1.29 |
| Example 3 | 1.92E+05 | 1.26E+05 | 1.53 |
| Example 4 | 1.72E+05 | 1.51E+05 | 1.14 |
| Comparative Example 1 | 3.49E+04 | 3.76E+04 | 0.93 |
| Comparative Example 2 | 3.96E+04 | 3.94E+04 | 1.01 |

As shown in FIGS. 19 to 22, the K concentration in the piezoelectric layer 70 of each Example exhibited characteristic distribution state in the first piezoelectric film 74. In other words, the K concentration in the piezoelectric layer 70 had a K local maximum value, which is a local maximum value of the K concentration, near the boundary between the first piezoelectric film and the second piezoelectric film; and a gradient decreasing from the K local maximum value toward the first electrode 60.

When a value at an inflection point of the K concentration near the boundary between the first piezoelectric film and the first electrode 60 is set to be a K inflection value, a ratio of the K local maximum value to the K inflection value (K local maximum value/K inflection value) was calculated from the SIMS result for each Example, and is shown in Table 2. As shown in Table 2, the K ratio (K local maximum value/K inflection value) for each Example was within the range of 1.15 or higher and 2.0 or lower.

Meanwhile, a ratio of the K local maximum value to the K inflection value (K local maximum value/K inflection value) was calculated from the SIMS result for each Comparative Example, and is shown in Table 2. As shown in Table 2, the K ratio (K local maximum value/K inflection value) for each Comparative Example is smaller than those of Examples.

TABLE 2

| | K Local Maximum Value (cps) | K Inflection Value (cps) | K Local Maximum Value/K Inflection Value |
|---|---|---|---|
| Example 1 | 5.54E+03 | 4.24E+03 | 1.31 |
| Example 2 | 6.33E+03 | 3.47E+03 | 1.82 |
| Example 3 | 5.12E+04 | 2.61E+04 | 1.96 |
| Example 4 | 3.64E+04 | 2.45E+04 | 1.48 |
| Comparative Example 1 | 4.48E+03 | 4.00E+03 | 1.12 |
| Comparative Example 2 | 4.89E+03 | 4.57E+03 | 1.07 |

XRD Measurement

Figure 25:
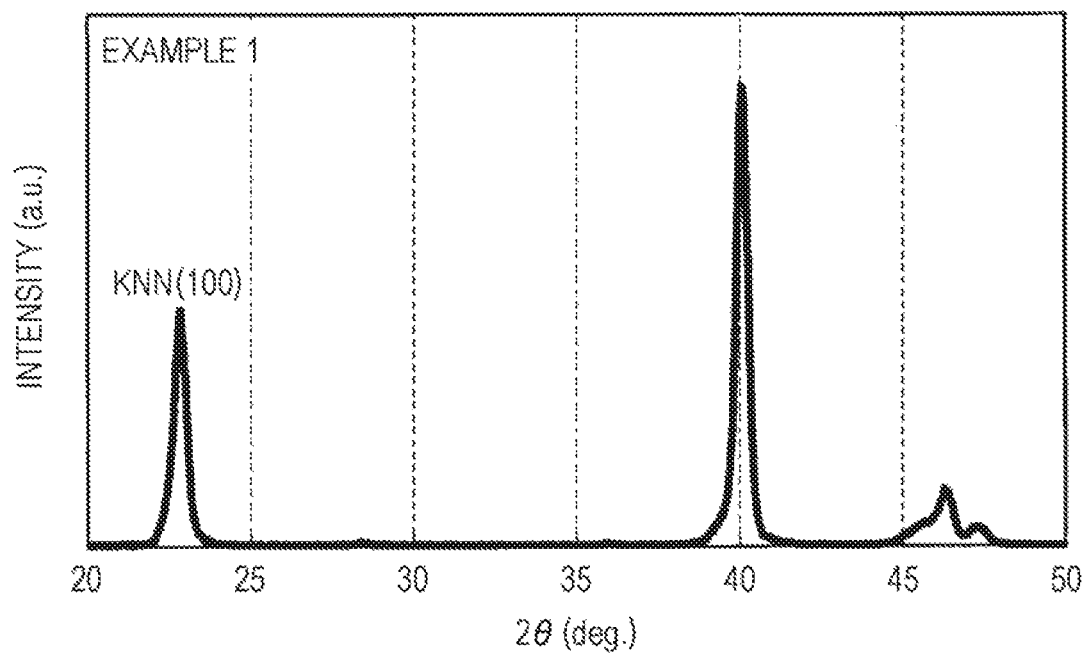
FIG. 25 is a graph indicating the x-ray diffraction pattern for Example 1.

For Example 1 and Comparative Example 1, the x-ray diffraction patterns of the piezoelectric layers 70 were measured at room temperature by an x-ray diffraction (XRD) method using a "D8 Discover" (Bruker AXS GmbH). In the measurement, Cu Kα as an X-ray source and a two-dimensional detector (GADDS) as a detector were used. FIG. 25 shows the x-ray diffraction pattern for Example 1, whereas FIG. 26 shows the x-ray diffraction pattern for Comparative Example 1.

In the x-ray diffraction pattern for KNN (piezoelectric layer 70), a peak originated from the (100)-plane and a peak originated from the (110)-plane are generally observed at 2θ of near 22.5° and 2θ of near 32.0°, respectively. A peak observed near 40° is a peak originated from Pt (first electrode 60).

As shown in FIG. 25, since a large peak at 2θ of near 22.5°, but not a peak near 32.0°, was observed, the piezoelectric layer 70 of Example 1 was found to be (100)-oriented. Although not shown, the piezoelectric layer 70 of each of Examples 2 to 4 was also found to be (100)-oriented, like the piezoelectric layer 70 of Example 1.

Figure 26:
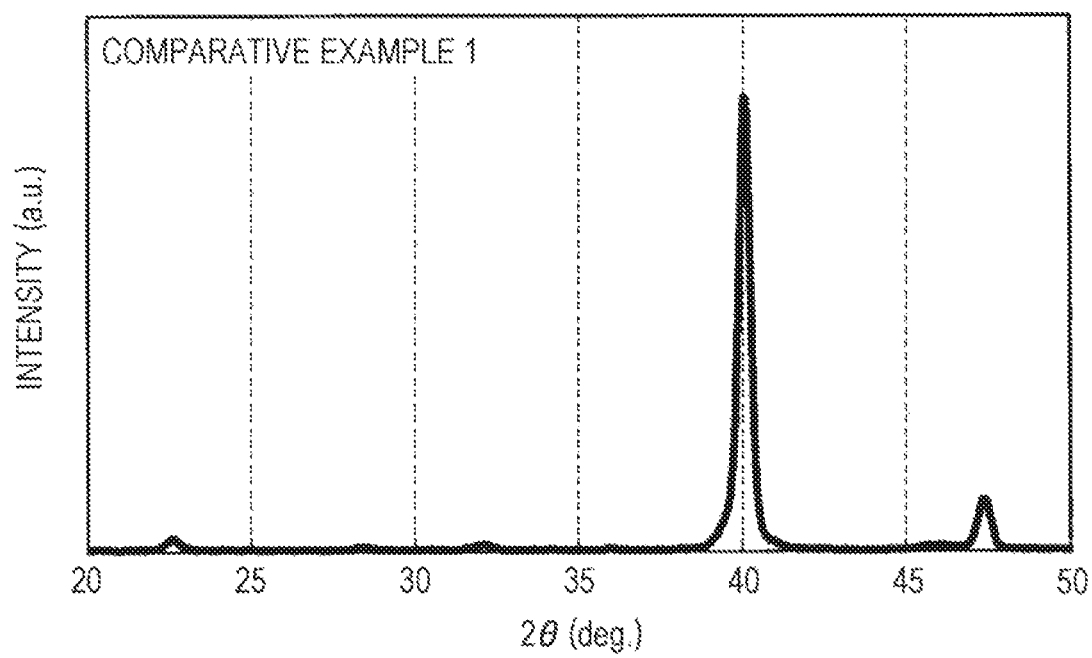
FIG. 26 is a graph indicating the x-ray diffraction pattern for Comparative Example 1.

In contrast, as shown in FIG. 26, since extremely small peaks were observed at 2θ of near 22.5° and near 32.0°, the piezoelectric layer 70 of Comparative Example 1 was found to have the random orientation. Although not shown, the piezoelectric layer 70 of Comparative Example 2 was also found to have the random orientation, like the piezoelectric layer 70 of Comparative Example 1.

Based on the above-mentioned SIMS results and XRD measurement results, in each Example, in which the intensity ratio of the Na local maximum value to the Na local minimum value (Na local maximum value/Na local minimum value) in the SIMS was 1.05 or higher and 1.6 or lower, and the intensity ratio of the K local maximum value to the K inflection value (K local maximum value/K inflection value) in the SIMS was 1.15 or higher and 2.0 or lower, it has become evident that the (100)-oriented piezoelectric layer 70 was obtained.

In contrast, in each of Comparative Examples that did not satisfy the above conditions, it has become evident that the piezoelectric layer 70 of the random orientation, rather than the (100) orientation, was obtained.

Other Embodiments

In the above-described embodiment, a liquid ejecting head, which is mounted on a liquid ejecting apparatus, is described as an example of a piezoelectric element-applied device. The scope of applications of the invention, however, is not limited to this. Although an ink jet recording head is described as an example of a liquid ejecting head, the invention is certainly applicable to a liquid ejecting head that ejects a liquid other than ink. Examples of liquid ejecting heads that eject liquids other than ink include a colorant ejecting head employed in the manufacture of a color filter for a liquid crystal display, for example; an organic EL material ejecting head employed in the formation of an emissive layer and a charge transport layer of an organic EL display; an electrode material ejecting head employed in the formation of an electrode pattern by printing using an electrode precursor solution; a curable material ejecting head for three-dimensional customized fabrication (3D printing) through repeated ejection of a material and curing of the material by light and/or heat; a piezoelectric material ejecting head for forming a certain piezoelectric element pattern by printing using a piezoelectric material precursor solution and heat treatment; and an organic biomaterial ejecting head employed in the manufacture of a biochip.

The piezoelectric element and the piezoelectric element-applied device of the invention have good piezoelectric characteristics and are thus suitable for a piezoelectric actuator. Specific examples of the piezoelectric actuators include an ultrasonic transmitter, an ultrasonic motor, a vibration-type dust removal device, a piezoelectric transducer, a piezoelectric speaker, a piezoelectric pump, a temperature-electricity converter, and a pressure-electricity converter.

The piezoelectric element and the piezoelectric element-applied device of the invention have high piezoelectric performance and are thus suitably employed as a piezoelectric sensor element. Specific examples of the sensor elements include an ultrasonic detector (ultrasonic sensor), an angular velocity sensor (gyro sensor), an acceleration sensor, a vibration sensor, a tilt sensor, a pressure sensor, a collision sensor, a motion sensor, an infrared sensor, a terahertz sensor, a heat detection sensor (thermal sensor), a pyroelectric sensor, and a piezoelectric sensor. Other applications include filters, such as a filter for shielding harmful rays, such as infrared rays; an optical filter utilizing photonic crystal effects by quantum dot formation; and an optical filter utilizing optical interference of thin films.

Regarding an ultrasonic sensor-mounted ultrasonic measuring apparatus, an ultrasonic measuring apparatus can also be formed by including the piezoelectric element of the invention and a control unit for measuring a detection object by using signals based on at least one of ultrasound transmitted from the piezoelectric element of the invention and ultrasound received by the piezoelectric element of the invention. Such an ultrasonic measuring apparatus obtains information about the position, shape, and velocity, for example, of a measurement object, based on the time after transmitting ultrasound until receiving an echo signal of the transmitted ultrasound reflected and returned by the measurement object. In such an apparatus, a piezoelectric element may be employed as an ultrasound generating element and/or an echo signal detecting element. Such an ultrasound generating element and/or an echo signal detecting element can provide an ultrasonic measuring apparatus with excellent displacement characteristics.

The piezoelectric element and the piezoelectric element-applied device of the invention have high ferroelectricity, and are thus suitably employed as ferroelectric elements. Specific examples of the ferroelectric elements include a ferroelectric memory (FeRAM), a ferroelectric transistor (FeFET), a ferroelectric arithmetic circuit (FeLogic), and a ferroelectric capacitor.

The piezoelectric element and the piezoelectric element-applied device of the invention can control domains by using voltage and are thus suitably employed as voltage-controlled optical elements. Specific examples of the optical elements include a wavelength converter, an optical waveguide, an optical path modulator, a refractive index control element, and an electronic shutter mechanism.

The piezoelectric element and the piezoelectric element-applied device of the invention exhibit good pyroelectric characteristics and are thus suitably employed as pyroelectric elements. Further applications include, for example, a robot utilizing the above-mentioned various motors as driving sources.

What is claimed is:

1. A piezoelectric element comprising:
a substrate;
a first electrode formed on the substrate;
a piezoelectric layer formed on the first electrode, the piezoelectric layer being a layered structure of a plurality of piezoelectric films each containing potassium, sodium, and niobium; and
a second electrode formed on the piezoelectric layer, wherein
a sodium concentration in the piezoelectric layer has a Na local maximum value in a first piezoelectric film in the vicinity of the first electrode, the Na local maximum value being a local maximum value of the sodium concentration, the first piezoelectric film being among the plurality of the piezoelectric films, a sodium concentration gradient decreasing from the Na local maximum value toward the second electrode, and a Na local minimum value near a boundary between the first piezoelectric film and a second piezoelectric film formed immediately above the first piezoelectric film, the Na local minimum value being a local minimum value of the sodium concentration.

2. The piezoelectric element according to claim 1, wherein an intensity ratio of the Na local maximum value to the Na local minimum value (Na local maximum value/Na local minimum value) in SIMS is 1.05 or higher.

3. The piezoelectric element according to claim 2, wherein the intensity ratio of the Na local maximum value to the Na local minimum value (Na local maximum value/Na local minimum value) in SIMS is 1.6 or lower.

4. The piezoelectric element according to claim 1, wherein a potassium concentration in the piezoelectric layer has a K local maximum value near the boundary between the first piezoelectric film and the second piezoelectric film, the K local maximum value being a local maximum value of the potassium concentration, and a potassium concentration gradient decreasing from the K local maximum value toward the first electrode.

5. The piezoelectric element according to claim 4, wherein an intensity ratio of the K local maximum value to a K inflection value (K local maximum value/K inflection value) in SIMS is 1.15 or higher, the K inflection value being a value at an inflection point of the potassium concentration near a boundary between the first piezoelectric film and the first electrode.

6. The piezoelectric element according to claim 5, wherein the intensity ratio of the K local maximum value to the K inflection value (K local maximum value/K inflection value) in SIMS is 2.0 or lower.

7. The piezoelectric element according to claim 1, wherein the piezoelectric layer contains 0.2 mol % or more and 2.0 mol % or less manganese.

8. The piezoelectric element according to claim 1, wherein the substrate includes zirconium oxide.

9. A piezoelectric element-applied device comprising the piezoelectric element according to claim 1.

10. A piezoelectric element-applied device comprising the piezoelectric element according to claim 2.

11. A piezoelectric element-applied device comprising the piezoelectric element according to claim 3.

12. A piezoelectric element-applied device comprising the piezoelectric element according to claim 4.

13. A piezoelectric element-applied device comprising the piezoelectric element according to claim 5.

14. A piezoelectric element-applied device comprising the piezoelectric element according to claim 6.

15. A piezoelectric element-applied device comprising the piezoelectric element according to claim 7.

16. A piezoelectric element-applied device comprising the piezoelectric element according to claim 8.

* * * * *